United States Patent [19]

Del Monte

[11] Patent Number: 5,704,060

[45] Date of Patent: Dec. 30, 1997

[54] TEXT STORAGE AND RETRIEVAL SYSTEM AND METHOD

[76] Inventor: Michael G. Del Monte, 417 Cabrillo Ter., Corona Del Mar, Calif. 92625

[21] Appl. No.: 445,661

[22] Filed: May 22, 1995

[51] Int. Cl.$^6$ .................................................. G06F 17/30
[52] U.S. Cl. ............... 395/600; 364/419.13; 364/419.19; 364/DIG. 1; 364/225.4
[58] Field of Search ..................... 395/148, 600; 364/419.13, 419.19; 341/51, 55, 65, 76, 87, 89

[56] References Cited

U.S. PATENT DOCUMENTS

| | | | |
|---|---|---|---|
| 3,651,483 | 3/1972 | Clark IV et al. | 395/800 |
| 4,285,049 | 8/1981 | Bird et al. | 395/483 |
| 4,597,057 | 6/1986 | Snow | 395/375 |
| 4,674,066 | 6/1987 | Kucera | 395/600 |
| 4,929,946 | 5/1990 | O'Brien et al. | 341/87 |
| 4,996,662 | 2/1991 | Cooper et al. | 395/600 |
| 5,058,144 | 10/1991 | Fiala et al. | 375/240 |
| 5,099,426 | 3/1992 | Carlgren et al. | 364/419.13 |
| 5,109,433 | 4/1992 | Notenboom | 382/240 |
| 5,153,831 | 10/1992 | Yianilos | 364/419.13 |
| 5,276,616 | 1/1994 | Kuga et al. | 364/419.08 |
| 5,293,552 | 3/1994 | Aalbersberg | 364/419.19 |
| 5,369,577 | 11/1994 | Kadashevich et al. | 364/419.13 |
| 5,374,928 | 12/1994 | Moore et al. | 341/67 |
| 5,383,029 | 1/1995 | Kojima | 358/403 |

OTHER PUBLICATIONS

Zobel & Moffat, "Adding Compression to a Full-text Retrieval System," Software—Practice and Experience, vol. 25(8), 891–903 (Aug. 1995).

Shertzer, "The Elements of Grammar", 1986, pp. 8–14.

*Primary Examiner*—Thomas G. Black
*Assistant Examiner*—John C. Loomis

[57] ABSTRACT

An improved method and system for storing and retrieving information written as text. The method and system store most words of the text solely in an inverted structure, and the remainder of the text's information in an auxiliary structure. The structures can be quickly searched for keyword information, provide highly efficient storage, and can be reconstituted into the original text.

20 Claims, 11 Drawing Sheets

TEXT STORAGE AND RETRIEVAL SYSTEM AND METHOD

FIELD OF THE INVENTION

This invention is a method and system for storing and retrieving information. More particularly, it is a method and system for compressing, storing, searching, retrieving, and decompressing information written as text.

BACKGROUND OF THE INVENTION

Text is the primary way that human knowledge is stored, and, after speech, the primary way it is transmitted. As it is commonly represented in computer systems, however, text is a particularly inefficient and unmanageable form of information. Its usual format—a linear series of bytes encoding characters, blank spaces, punctuation symbols, and formatting codes—is ideal for generating and editing documents, such as in a word processor. The linear format makes it extremely easy to insert, delete, and replace individual characters in a document. Unfortunately, this same format is also most commonly used to store text documents, long after the text is written and needs no further revision.

As a storage format, a linear sequence of bytes representing characters carries significant penalties, in both storage size and access speed. Typically, each byte in a text document encodes a single letter or a single punctuation symbol. Altogether there are roughly ninety-four such characters in typical English text: the fifty-two letters (uppercase and lowercase), ten digits, and thirty-two common punctuation symbols, as represented in the American Standard Code for Information Interchange (ASCII). Because a single byte can represent one of 256 different values, the remaining 162 values are typically used by English word processing programs to encode formatting symbols, international characters, and special punctuation marks. Some of these codes are also used as flags, to indicate that later bytes in the linear sequence do not represent characters, but instead define structures such as columns, tables, or figures in the text, or indicate font changes. Since the great majority of bytes in a text document represent characters, however, each byte "wastes" approximately two-thirds of its range.

The linear storage format similarly limits access to the underlying information in a text document. Text information is embodied in words, not characters, and furthermore relatively few of these words are significant. The only way to locate an important, concept-defining word ("keyword") in a document stored as linear text is to scan the text using a pattern-matching algorithm. Although advances in this field—notably the Knuth-Morris-Pratt and Boyer-Moore text searching algorithms—can improve the speed of a linear word search over the traditional "naive" technique (sequentially comparing each byte in the document with each byte in the searched-for word), a pattern-matching algorithm must still traverse the entire document to be sure that it has found every instance of a particular keyword. Moreover, in English, for example, nearly one half of the words in a document are articles, conjunctions, prepositions, or common modifiers, all of which have a very low information content. Thus, a linear keyword search algorithm spends roughly half its time considering, and discarding, useless words.

Attempts to improve the storage efficiency of text documents have generally been made along lines entirely separate from attempts to improve access efficiency. This is because increasing storage efficiency ("compressing" a document) tends to decrease access speed, since the compressed document must be decompressed before it is searched. Similarly, increasing access efficiency ("indexing" a document, by building a list of keywords in the document) is usually accompanied by a decrease in storage efficiency, because indexes and related structures, such as pointer tables or signature files, require additional storage space.

Text compression techniques have generally focused on a linear replacement of bytes in the document with codes that either (1) individually represent more than one byte in the original document, or (2) individually require fewer bits (on average) than an eight-bit byte to represent the same character. The Lempel-Ziv algorithm, and its variants, is an example of the first type of compression; the static Huffman code is an example of the second. Both techniques achieve a compression ratio of between 50% and 70% for English text (resulting in a compressed document that is between 30% and 50% its original size). Each of these techniques, however, again produces a linear document, which must furthermore be decompressed, at least in part, before it is searched. Moreover, both techniques require expensive (in terms of speed) bit manipulations that can be difficult to implement on machines not rich in partial word or partial byte instructions.

Text indexing techniques, on the other hand, have generally focused on building an external index, signature file, or similar structure, that encodes, for quick retrieval, the important keywords in a set of documents. These systems either rely on a human operator to identify the documents' keywords, or, as in most automated systems, simply index every word in the document set, excepting very common words (called "stopwords"). The keywords for indexed documents can be searched extremely quickly: the search usually consists of simply reading the index to discover which documents contain a particular keyword. Unfortunately, the index or signature files often require considerable storage space. A comprehensive index, for example, which contains document and word position information for every significant word in a document set, is usually from 50% to 100% the size of the original document set.

There is thus a need for a method and system that increases both storage efficiency and access efficiency for text documents. This invention achieves both of these goals.

SUMMARY OF THE INVENTION

This invention is a system and method for compressing, storing, searching, retrieving, and decompressing information written as text. The system and method provide the significant advantage of simultaneously improving both the storage efficiency and the access efficiency for text documents. The system and method create a highly compressed data structure that allows the text of documents stored in the structure to be keyword searched and, furthermore, proximity searched, in their native, compressed format.

The system and method of this invention comprise a lexical parser which divides the text of a document into search terms (i.e., those words of the document that have medium to high information content) and all other information. "All other information" includes the punctuation between the search terms, "stopwords" (those words that have low information content, such as the and of), and formatting information. The system and method of this invention further store the search terms solely in an inverted structure; that is, the search terms are stored uniquely, together with the list of all positions in the document at which those terms occur. The system and method of this invention also store the "other information" of the document in an auxiliary data structure. The inverted structure, together with the auxiliary data structure, contain sufficient information substantially to reproduce the original text of the document. The inverted structure which stores the search terms provides the significant advantage of allowing the document to be easily keyword searched and proximity searched, because keywords (i.e., the search terms) and their positions within the document may be quickly looked up in the inverted structure, in much the same way one uses the index of a book. Moreover, because the search terms of the text are stored solely in the inverted structure, the system and method of this invention provide a significant degree of compression in storing the document.

In accordance with another objective of this invention, the positions corresponding to the search terms stored within the inverted structure are assigned in a manner that counts each search term within the document as occupying a single position, and each instance of "other information" in the document as one or more positions. This aspect of the invention provides the significant advantage of assigning positions to the search terms of the text such that the positions can be used both for proximity searches and for reconstructing the text of the document. These positions, termed fuzzy positions in this specification, strike a balance between providing reasonably accurate information regarding the relative positions of search terms within the text, and providing information regarding the position and size of the "other information" lying between the search terms. The dual utility of these "fuzzy" positions provide both increased storage efficiency and increased access efficiency for text documents.

In accordance with another objective of this invention, the search terms of the document are converted to their lemmas, or root forms, before storage in the inverted structure. This aspect of the invention increases the storage efficiency of the structure by requiring the storage of only a single form of related search terms, and simultaneously improves access efficiency for keyword searching because only a single form of a keyword need be looked up in the inverted structure to retrieve instances of all forms of the keyword in the document.

In accordance with a further objective of this invention, the search terms of the document are stored in the inverted structure by reference to a second auxiliary data structure which contains those terms. This aspect of the invention provides the significant advantage of improving the storage efficiency of the search terms in the inverted structure, by requiring them to be stored only by reference; and simultaneously improves access efficiency, where multiple documents are stored, by placing the actual search terms of all of the documents in one location, where they may be easily looked up (although, it must be noted, the second auxiliary data structure of the preferred embodiment comprises more than one file).

In accordance with yet another objective of this invention, the search terms (whether stored directly in the inverted structure, or stored by reference to an auxiliary structure) are compressed. Similarly, the list of positions stored in the inverted structure of this invention may also be compressed. Both of these aspects enhance the storage efficiency of the system, while not significantly affecting access efficiency, because only a portion of the document (i.e., the portion containing the search terms) need be decompressed to conduct a keyword or proximity search.

In accordance with another objective of this invention, a highly advantageous compression technique is provided.

This compression technique, termed block compression in this specification, uses a uniquely generated list of substrings to compress strings—such as the search terms and the "other information" lying between search terms identified by the lexical parser of this invention—which commonly contain those substrings. Block compression provides the significant and unexpected advantages of (1) compressing information; (2) reducing the "unit count" (i.e., the number of symbols in the compressed string) of the compressed information; (3) providing increased compression for longer strings, at the expense of providing decreased compression for shorter strings—an advantage for fixed-length storage structures; and (4) providing increased compression for low information content strings (such as words formed of long, but common prefixes or suffixes, like anthropology or determination), at the expense of decreased compression for high information content strings (such as nonsense words, codes, or abbreviations, like int'l or xr4ti) -an advantage for keyword storage and searching systems, where the entire length of a common keyword must be stored, to distinguish it from other words, but where only the first few characters of a nonsense word need be stored to distinguish it from others. For these reasons, block compression is particularly useful in compressing the search terms and "other information" in the preferred embodiment of this invention.

In accordance with yet another aspect of this invention, a reversible singularization method for words is provided. The reversible singularization method is capable of transforming most plural words into a second form that is usually the singular form of the word. The method provides the significant advantage of ensuring that the second form is always capable of being transformed back into the original (plural) word, without error. This advantage is particularly useful for performing morphological transformations in the preferred embodiment of this invention, because it is capable of converting plural or plural-appearing jargon or proper nouns, such as metacodes or Addickes, into an approximate singular form that can always be converted back into the original word.

DESCRIPTION OF THE PREFERRED EMBODIMENTS

I. Overview

The system and method of this invention transform one or more text documents into a data structure termed an archive of the documents. The archive structure is highly compressed, requiring far less storage space than the original documents, but it contains all of the information necessary to rebuild the original documents. In this sense, the invention is similar to multiple-document compressing or archiving systems such as the UNIX "tar" and "zip" programs, and the IBM-PC "pkzip" and "lharc" utilities. However, the archive structure of this invention achieves better compression than these programs, partly because the structure is designed to compress only text.

More importantly, however, the archive structure stores the search terms of all of the original documents (excepting a handful of common words, called stopwords) in a compact "inverted" structure. (An inverted file or data structure is one in which each unique term in the document is stored, followed by a list of its positions within the document. In a linear file, by contrast, terms are stored sequentially in the order in which they appear.) Because the search terms of the document are stored in an inverted structure—and only in an inverted structure—keyword searches of documents stored in the archive are exceptionally fast. In effect, documents in the archive are keyword-searchable in their native, compressed format: only a very small degree of decompression is required, and only for the segment of the archive that contains the search terms.

Figure 1:
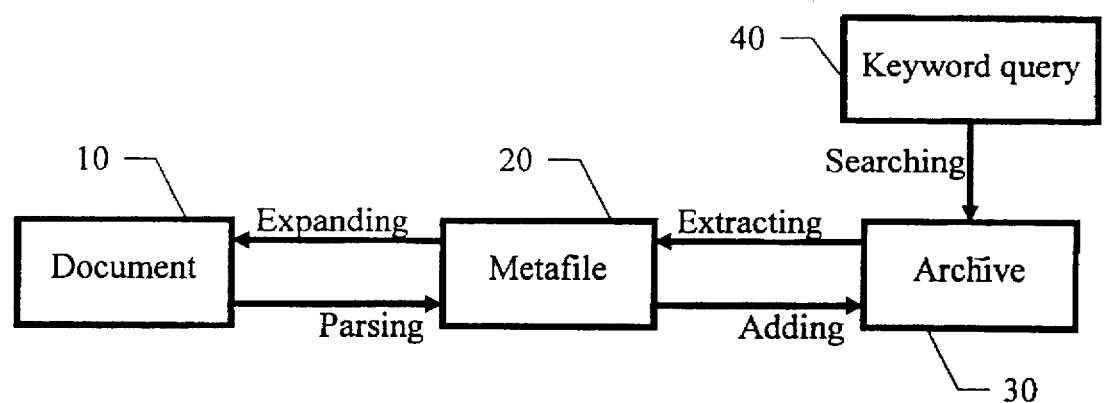
FIG. 1 is a block diagram showing the relationship between an original document, its metafile representation, and the archive of this invention.

FIG. 1 diagrams the basic structure of the preferred embodiment of this invention, and introduces some of the terms used in the discussion below. A text document 10 is parsed into a set of component structures, termed a metafile 20. The metafile 20 may then be added to the archive 30. The archive 30 can be searched to locate documents that match a keyword query 40; matching documents are first extracted from the archive into the metafile 20 format, and then expanded into the original document 10, for printing or editing in a word processor.

II. The Metafile

Although it is possible to convert a text document into its archive representation and add it directly to the archive structure, it is preferable to parse the document into an interim structure before adding it to the archive. This interim structure, termed a metafile, enables the user (or another system) to review the document, in the form in which it will be stored in the archive, before it is actually added to the archive. This may be necessary because some changes may be made to the document, in the interests of storage efficiency, before it is added to the archive. In addition, creating an interim structure allows nearly all of the parsing and compressing steps to be completed before the document is added to the archive. If an error were to occur during the creation of the metafile, the archiving process could be safely halted, leaving the archive structure unchanged.

Figure 2:
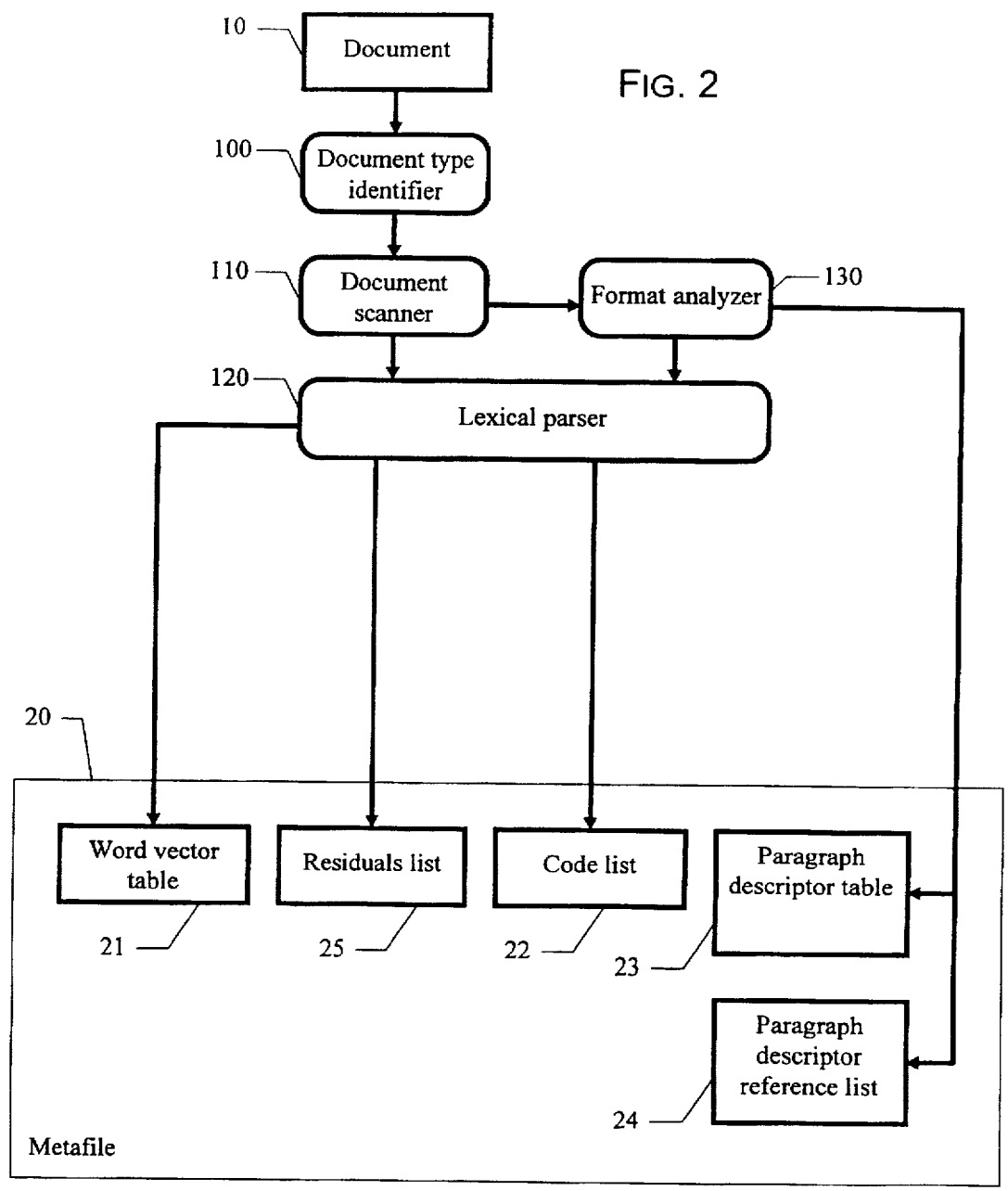
FIG. 2 is a block diagram showing the procedure for creating a metafile from an original document.

As shown in FIG. 2, the metafile 20 is a collection of separate components that completely describe the original document 10. In particular, the metafile 20 contains substructures that individually describe (1) the unique words in the document (i.e., each word in the document is listed once) together with a list of each word's position(s) within the document—this is the metafile's word vector table 21; (2) the punctuation that appears between words in the document, as well as formatting codes (e.g., typeface changes, new paragraphs) and special codes necessary to reconstruct accurately the document's text (e.g., recapitalization flags, morphological transformation flags, and non-searchable terms)—this is the metafile's code list 22; (3) the format of each paragraph in the document—this is the metafile's paragraph descriptor table (PDT) 23 and paragraph descriptor reference list 24; and (4) miscellaneous elements of the document that cannot be efficiently stored in any of the other substructures—this is the metafile's residuals list 25.

The metafile's word vector table 21 stores a list of all of the unique words in the document, together with a list of each word's positions(s) within the document. As will be discussed below, however, the words stored in the word vector table 21 do not exactly correspond to the words in the document: instead, regular noun and verb inflections (in English, for this embodiment) are converted to their lemmas (a lemma is the uninflected base form of a word); the words are all stored in lowercase only; and some common words (stopwords) are not stored here at all. The positions associated with each word in the word vector table 21 correspond roughly—but not exactly—to the location of the word in a sequential list of all of the document's words. That is, the first word of a document is assigned a position near 1, the tenth word is assigned a position near 10, the hundredth word is assigned position near 100, and so on. The assignment of positions to words is made by a lexical parser 120 (described below), and, as mentioned, it is not exact; instead, it strikes a balance between the need to accurately reconstruct the document, and the need to represent word positions relative to one another with sufficient accuracy that proximity searches (described below) can be reasonably accomplished. The positions of words stored in the word vector table 21 are therefore termed fuzzy positions.

Table 1. below, shows the construction of an example word vector table 21 from the first paragraph of J. R. R. Tolkein's "The Hobbit."

TABLE 1

Original document:

An Unexpected Party

In a hole in the ground there lived a hobbit. Not a nasty, dirty, wet hole, filled with the ends of worms and an oozy smell, nor yet a dry, bare, sandy hole with nothing in it to sit down on or to eat; it was a hobbit-hole, and that means comfort.

Word vector table:

bare 39; comfort 60; dirty 20; down 48; dry 37; eat 51; end 27; fill 25; ground 10; hobbit 15, 54; hole 8, 23, 42, 56; live 13; mean 59; nasty 18; noth 44; oozy. 31; party 5; sandy 41; sit 47; smell 32; unexpect 3; wet 22; worm 29; yet 35

Unexpected, the first non-stopword in the document, is converted to lowercase, morphologically transformed to its lemma, unexpect, and then assigned a position of 3. Comfort, the last word in the document, is assigned a position of 60. In some cases, such as in the phrase "sandy hole," the assigned word positions are truly adjacent: sandy is given position 41, and one of hole's positions is 42. In other cases, however, apparently adjacent words are separated by one or more positions, which correspond to codes required to reconstruct the original words and punctuation of the document: In "dry, bare," dry and bare are assigned positions 37 and 39, respectively, because the intervening comma and space are given position 38; in "ground there lived," ground and live are given positions 10 and 13, respectively, because the intervening stopword there is assigned position 11, and an invisible re-stemming flag, which converts live to lived, is assigned position 12. Note, however, that a compression technique (described below in Section VI) applied to these intervening codes in the preferred embodiment will, in most cases, reduce the "unit count" of the codes separating words, improving both storage efficiency and the accuracy of the word-position assignments. Thus, for example, in the phrase "hole, filled," hole and fill are given positions 23 and 25, respectively: the intervening comma and space and the re-stemming flag that converts fill to filled are represented by a single symbol at position 24.

The codes which represent the punctuation, formatting, morphological transformations, and stopwords which occur between terms stored in the word vector table 21 are termed metacodes, because, like the metafile, they exist only temporarily, during creation of the archive structure. These codes are assembled in the sequence in which they occur in the original document 10, then compressed and stored in the metafile's code list 22. The set of metacodes used in the preferred embodiment is defined as shown in Table 2, below.

(underlines, italics, boldface) flags, and word completion codes for very long words not easily stored by the system. These codes are described more fully below.

III. Parsing a Text Document into a Metafile

FIG. 2 illustrates the procedure for parsing a text document 10 into its metafile 20 representation. The original document 10 is first tested, by a type identifier function 100, to determine what type of document it is: ASCII text, for example, or a document created by a word processor such as Word Perfect™. Documents created by programs such as word processors are commonly marked in some fashion to identify their creator. Word Perfect™ documents, for example, carry a short header that identifies the document as a Word Perfect™ document, and indicates what version of Word Perfect™ was used to create it. Preferably, the type identifier function 100 tests for a series of anticipated document types, and only returns a document type of ASCII if no other type is discovered first.

The document 10 is then linked to a document scanner 110 which is suited to read documents of the type identified by the type identifier function 100. The document scanner 110 provides the basic service of returning, one item at a time, the characters and formatting codes of the document 10. The scanner 110 may also provide some translation services, such as converting extended characters deliberately not recognized by the rest of the system (e.g., Greek letters, mathematical symbols) to approximately equivalent, recognized characters. To offer the simplest example, a scanner 110 for an ASCII document might simply return, in

TABLE 2

1. A set of common punctuation symbols. In the preferred embodiment, the following symbols are supported: !@#$%&*()—+=[];:'",./?<>— ¶. Three- and four-period ellipses are also supported.
2. The set of stopwords. Each stopword is assigned a separate metacode.
3. The set of morphological transformation codes. In the preferred embodiment, the following codes are supported: caps, allcaps, specialcaps, plural, possessive, plusEd, plusIng, resid. (The meanings of these codes are discussed below.)
4. Space—the space character.
5. Newpage—signals the beginning of a new page in the document.
6. Newparagraph—signals the beginning of a new paragraph.
7. Format on/off—toggles a word emphasis style; in the preferred embodiment, recognized word emphasis styles are underline, boldface, and italics.
8. Note—signals the beginning or ending of a footnote or endnote.
9. Repeat—indicates that the next metacode is to be repeated n times (where n is preferably stored in the residuals list 25, as described below).

To improve the storage efficiency of the archive structure, the paragraph format of the original document 10 is stored as a table and a list of references to that table, rather than embedding paragraph format information directly within the code list 22. For this reason, the list of metacodes contains only one paragraph formatting code, the new paragraph signal. The actual formats of paragraphs are stored in the metafile's 20 paragraph descriptor table (PDT) 23. (The entries in the PDT 23, called paragraph descriptor codes will be explained in more detail below.) The metafile 20 also contains a paragraph descriptor reference list 24, which indicates, for each paragraph in the document 10 seriatim, the paragraph descriptor code that is associated with that paragraph.

Finally, any other information about the document 10 not easily or efficiently stored in the other four substructures of the metafile 20 is stored in the metafile's residuals list 25. In the preferred embodiment, the residuals list 25 contains miscellaneous information such as word emphasis sequence, each character in the document (converting unsupported characters, such as the ^ symbol, to a generic symbol such as @, along the way). Of course, in the preferred embodiment a slightly more complex ASCII document scanner 110 is desirable, to account, for example, for the different end-of-line or end-of-paragraph delimiters commonly present in ASCII documents. (Preferably, this scanner 110 first determines which type of delimiter the document uses, and then converts each instance of that delimiter to the generic return symbol recognized by the rest of the system; see Table 3, below). A scanner 110 for Word Perfect™ documents, by contrast, must not only return the characters of the document 10, but must also convert Word Perfect™ formatting codes to equivalent formatting codes recognized by the rest of the system.

By using a document scanner 110 keyed to the original document's type, a wide variety of documents 10 can be converted directly into metafile 20 representations, without the need for intermediate file conversions. To accomplish this goal, the system's format analyzer 130 and lexical parser 120 (both described in more detail below) are each designed to accept the sequence of single characters or codes returned by the scanner 110. In the preferred embodiment, the scanner 110 returns either the characters of the document 10, or one of the generic formatting codes listed in Table 3, below.

TABLE 3

New page—signals the beginning of a new page in the document.
Format on/off—toggles a word emphasis style; in the preferred embodiment, recognized word emphasis styles are underline, boldface; and italics.
Note—signals the beginning or ending of a footnote or endnote.
Tab—indicates that the next paragraph begins at a new horizontal position on the page.
Indent—indicates that the next paragraph is indented (or outdented), that is, it has a left, and possibly also right, margin different than the previous paragraph style.
Return—signals the end of a paragraph; inline-delimited documents, return signals the ends of lines, which may then be merged into paragraphs by a line merge function 134 (see below).
Margin change—indicates that all new paragraphs will have left and/or right margins different than the previous paragraph style.
Leading change—indicates that all new paragraphs will have primary and/or secondary leadings different than the previous paragraph style.
Justification change—indicates that all new paragraphs will have a justification different than the previous paragraph style.

For some of these codes, additional information is required besides the code itself. For this reason, it is desirable that the scanner 110 contain an auxiliary "information" field that holds information related to the last returned code. The information field for the code tab for example, should contain the tab position and the tab type (e.g., left, right, center); the information field for the format on/off code should contain the type of format to be toggled (e.g., underline, italic, boldface).

A. Format Analysis

The format analyzer 130 takes its input from the scanner 110, scanning the entire document 10 to gather a list of "paragraph descriptor codes" that describe each paragraph type in the document 10. Even before this operation, however, the format analyzer 130 briefly scans the beginning of the document 10 in order to determine whether the document 10 is line- or paragraph-delimited. For this purpose, a simple function merely counts the number of lines read by the scanner, and the number of "long lines"—those lines whose lengths exceed the expected boundaries of the document. If greater than 2% of the lines read are long lines, then the document 10 is considered paragraph-delimited.

Figure 3:
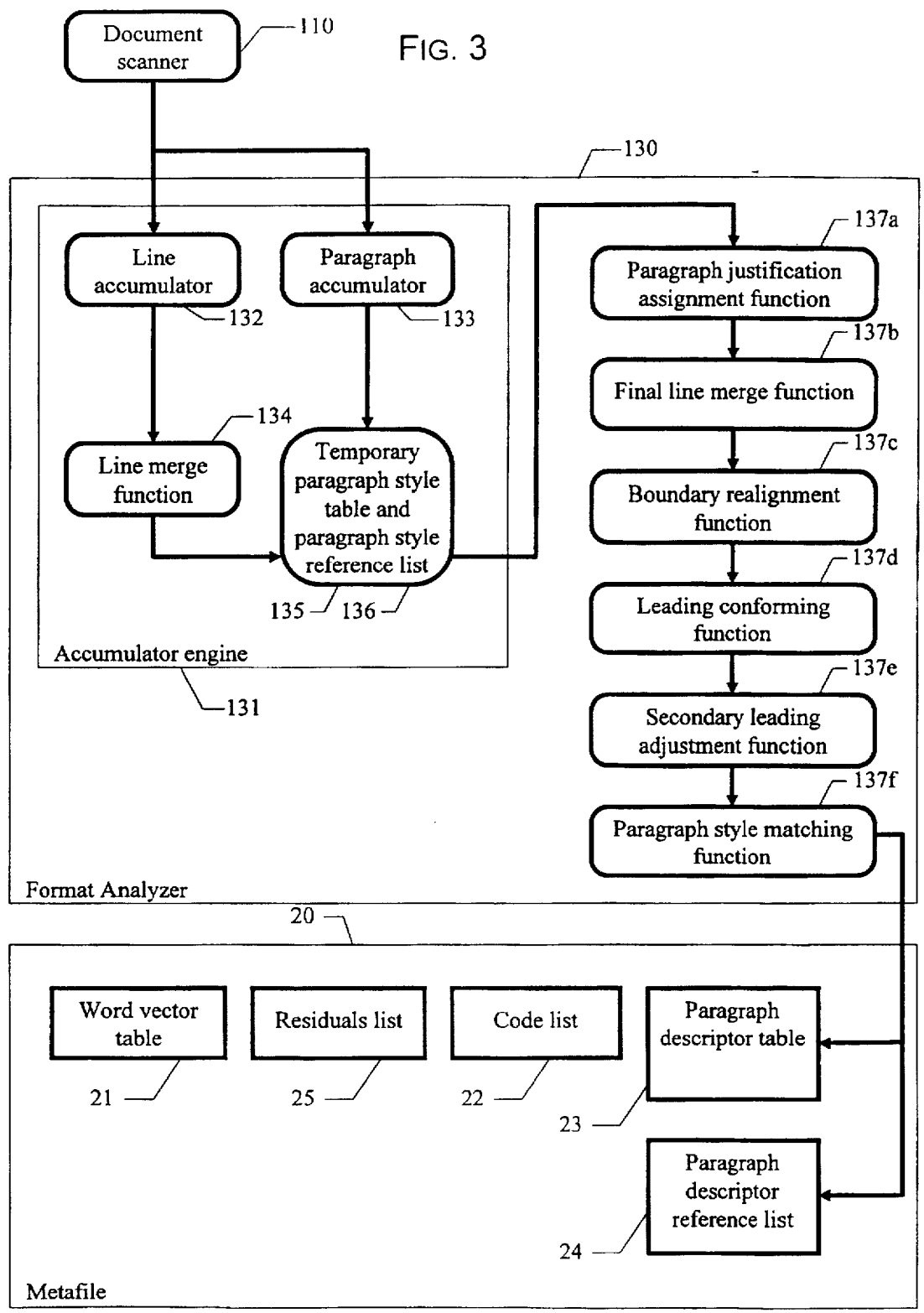
FIG. 3 is a block diagram showing the procedure for analyzing the format of a document.

FIG. 3 depicts the operation of the format analyzer 130, once the delimiting type of the document has been decided. As characters and codes are read in from the scanner 110, the format analyzer's accumulator engine 131 accumulates information about the document 10 in two forms: the boundaries of the current line, in the line accumulator 132, and the boundaries, leading, and format of the current paragraph, in the paragraph accumulator 133.

If the document 10 is line-delimited, then the accumulator engine 131 attempts, through its line merge function 134, to synthesize information about paragraph styles that may encompass successive lines. So, for instance, if in a line-delimited document a series of four lines are not paragraphs in their own right, but are actually the lines of a single paragraph, the line merge function 134 will return the paragraph style that describes the paragraph comprised of those four lines. If instead the lines are each independent paragraphs (as, for example, in a heading block or a title), the line merge function 134 merely returns the paragraph styles that represent each line individually. In the preferred embodiment, the line merge function 134 only merges lines of paragraphs that appear to be left justified.

The line merge function 134 operates by testing pairs of lines to see whether they could be part of the same paragraph, based on a set of rules derived from the manner in which lines of text are normally broken at the right margin to form paragraphs. Where two lines appear to be "mergable," that is, part of the same paragraph, the line merge function 134 determines the minimum and maximum right margins of a paragraph containing those lines. As more succeeding lines are "merged" to that paragraph, the minimum and maximum right margins will converge on the true right margin of a paragraph comprised of those lines. When a succeeding line cannot belong to the paragraph, the line merge function 134 returns the margins, leading, and other information regarding that paragraph, and begins searching for the next paragraph. The line merge function 134 is described in pseudocode in Table 4, below.

TABLE 4

Define the following variables and objects:
Paragraph = an object corresponding to the currently analyzed paragraph of text, having RightMin and RightMax variables, which are the minimum and maximum right margins possible for the paragraph, respectively
First = an object corresponding to a first line of text, having Left and Right margins, a Center point measured midway between Left and Right, a Secondary leading (measured as the vertical spacing between this line and the previous one), a Format flag (true if the text of the line is all capitals), and a Justification (left, right, or center).
Second = an object like First, corresponding to a second line of text which immediately follows the first line of text;
IsFirst = a Boolean variable, true if First is the first line of text in Paragraph. (If; for

TABLE 4-continued example, First is the third line of text in Paragraph, then IsFirst = False.)
WordsInFirst = the number of words in First, treating words as sequences of symbols
  delimited by spaces.
LastRight = First.Right plus the length of the first word in Second, treating the word as
  the longest sequence of characters which cannot be broken according to English
  typesetting conventions (e.g., a sequence of characters not including a space or
  hyphen).
Tolerance = a variable defining the permissible misalignment of the right margin of
  Paragraph, to account for human or machine error in breaking the lines of
  Paragraph. In the preferred embodiment Tolerance is approximately 2 picas.
MinimumWords = a variable defining the minimum number of words in the first line of
  text in Paragraph, to prompt merging. In the preferred embodiment,
  MinimumWords is three.
  Then, for the variables defined above, First and Second can merge (ie., they
belong to the current Paragraph) if (((IsFirst = False) and (First.Left = Second.Left)) or
((IsFirst = True) and (First.Left <= Second.Center) and (Second.Left <= First.Center)))
and ((IsFirst = False) or ((Second.Secondary = First.Secondary) and (Second.Secondary
>= 1))) and ((Second.Right − LastRight) <= Tolerance) and ((Second.Right − RightMax)
<= Tolerance) and ((RightMin − LastRight) <= Tolerance) and (First.Justification =
Second.Justification = Left) and (First.Format = Second.Format) and ((IsFirst = False)
or (WordsInFirst >= MinimumWords)).
  If First and Second can merge, then Paragraph.RightMin =
max(Paragraph.RightMin, First.Right), and Paragraph.RightMax =
min(Paragraph.RightMax, LastRight), and if (Paragraph.RightMin >
Paragraph.RightMax), then swap(Paragraph.RightMin, Paragraph.RightMax).

---

As each new paragraph style is returned in the paragraph accumulator 133 (for paragraph-delimited documents) or the line merge function 134 (for line-delimited documents), the style is entered in a temporary paragraph style list 135. At the same time, the location of the start of the paragraph in the document that corresponds to that paragraph style, together with a cross-reference to the style list, is entered in a temporary paragraph style reference list 136. (Paragraph styles are added to the temporary style list 135 uniquely—that is, duplicate styles are not added. Instead, if a duplicate style is detected, the cross-reference added to the paragraph style reference list refers to the first occurrence of that paragraph style.)

Entries in the temporary style list 135 are termed paragraph descriptor codes. Each paragraph descriptor code must contain sufficient information to describe the layout of the current paragraph. Usually this information will include the left and right boundaries of the paragraph, and its primary and secondary leading. In the preferred embodiment, slightly more information is included about each paragraph: the paragraph style may include a first line indent, a justification code (e.g., the text of the paragraph may be left justified, right justified, or centered between its margins), and a format flag that indicates whether the entire paragraph should be written in uppercase letters. This additional information enhances the storage efficiency of the overall system, by eliminating many other otherwise necessary formatting codes.

Once the document 10 has been completely scanned, and the temporary style list 135 and paragraph style reference list 136 have been built, the format analyzer 130 attempts to minimize the number of paragraph styles necessary to describe the document. Line-delimited documents, in particular, will appear to have a large number of paragraph descriptor codes, because some lines will not have been merged by the line merge function 134, and because lines that are center or right justified will be recorded in the style list 135 as left justified paragraphs having odd margins. (Since most line-delimited documents have no format encoding other than spaces and horizontal tabs to indicate justification, the line accumulator 132 treats all lines as left justified, and records the actual boundaries of the text of the line as the margins of the paragraph.)

To refine the temporary style list 135 of line-delimited documents, the format analyzer 130 next attempts, as shown in FIG. 3, to assign to each paragraph style in the style list 135 its proper justification, through a paragraph justification assignment function 137a. (The justification assignment function 137a is not called for paragraph-delimited documents.) The justification assignment function 137a need only operate on those paragraph styles not merged by the line merge function 134, because those paragraph styles are assumed to be left justified paragraphs. The justification assignment is most easily and accurately accomplished by constructing an alignment point list that contains all possible alignment points for each paragraph style in the style list 135. (The alignment points of a paragraph style are its left boundary, its right boundary, and its center.) The frequency of occurrence of each alignment point is tallied as part of the list-building process. The alignment points of each paragraph style in the style list 135 are then matched against the alignment point list, and a "preferred" alignment point list is built by entering into this list the matching alignment point from the alignment point list having the greatest frequency. Ties are generally resolved in favor of left justification, although where alignment point appears to be centered between the document's margins, ties are resolved in favor of centering; and where the alignment point is right justified at the document's right margin, ties are resolved in favor of right justification. As before, the frequency of occurrence of each preferred alignment point is tallied as part of the list-building process. Finally, the alignment points of the paragraph styles in the style list 135 are again matched, this time against the preferred alignment point list. The matching alignment point having the highest/frequency indicates the preferred alignment of the paragraph style.

Next, for line-delimited documents only the temporary style list 135 is again scanned by a final line merge function 137b to determine if any successive left justified paragraph styles can be "merged," as before, to create a single paragraph style. The final line merge function 137b will merge any juxtaposed left justified paragraphs (lines) in the style list 135 that meet all of the criteria of Table 4, and for which the paragraph style that encompasses those lines (i.e., that particular combination of margins, leadings, and format) has already been encountered at some earlier point by the line merge function 134.

If desired, further refinement of the temporary style list 135 may be accomplished by a boundary realignment function 137c and a leading conforming function 137d. The boundary realignment function 137c attempts to realign all paragraph style boundaries so that they fall at regularly distributed points across the page. If the boundaries of a paragraph are at 11 picas (left) and 73 picas (right), for example, the boundary realignment function 137c might alter that paragraph style's boundaries to 10 picas and 75 picas, respectively. The effect of this function is to reduce the number of different paragraph styles, improving storage efficiency and, in many cases, improving the look of the reproduced document.

The leading conforming function 137d performs a similar role. It scans the entire temporary style list 135, altering the primary and secondary leading of each paragraph style to preferred norms—in the case of paragraph styles that appear to be body text (typically those having margins at or near the page boundaries, and consisting of three or more lines), primary and secondary leading are set to 1 and 2 lines, respectively; all other paragraph styles are unchanged, unless their secondary leading is greater than 2 lines, in which case it is changed to 2 lines. The result of the leading conforming function 137d is generally a reproduced document having more consistent vertical spacing, and better storage efficiency, as fewer paragraph styles are required to represent the document 10.

Next, the temporary style list 135 is scanned by the secondary leading adjustment function 137e to detect and delete high secondary leading, low frequency paragraph styles. These paragraph styles are infrequently used, but are distinct from other paragraph styles because their secondary leading is very large. Commonly, these styles occur at the first instance of a new heading, or a title block. To improve storage efficiency, the secondary leading adjustment function 137e deletes these styles, rereferences the paragraph style reference list 136 to an analogous paragraph style having a lower secondary leading, and inserts one or more "make-up" paragraph style references in the reference list 136 to compensate for the change in secondary leading. (The "make-up" paragraph style references have a secondary leading of one or more, and thus serve as place-holders between the current paragraph and the previous one.)

Finally, the temporary style list 135 is again scanned, by a paragraph style matching function 137f, to eliminate any duplicate styles that may have resulted from the operation of the previous five functions 137a–137e. The style matching function also updates the paragraph style reference list 136 to accommodate any changes made in the style list 135. The final style list 135 and reference list 136 comprise the metafile's paragraph descriptor table 23 and paragraph descriptor reference list 24, respectively.

B. Lexical Parsing

Returning now to FIG. 2, the scanner 110 is reset to the beginning of the document 10, so that the lexical parser 120 may use it to scan the document 10. However, the lexical parser 120 takes paragraph formatting information from the format analyzer 130, instead of from the scanner 110: as will be described below, the original document's 10 formatting is ignored in favor of the compact format information generated by the format analyzer 130.

The lexical parser 120 performs the function of separating the text of the document 10 into search terms (the words of the document that are not stopwords), metacodes (the punctuation, formatting, stopwords, and morphological transformation flags between search terms), and residuals (everything else).

Figure 4:
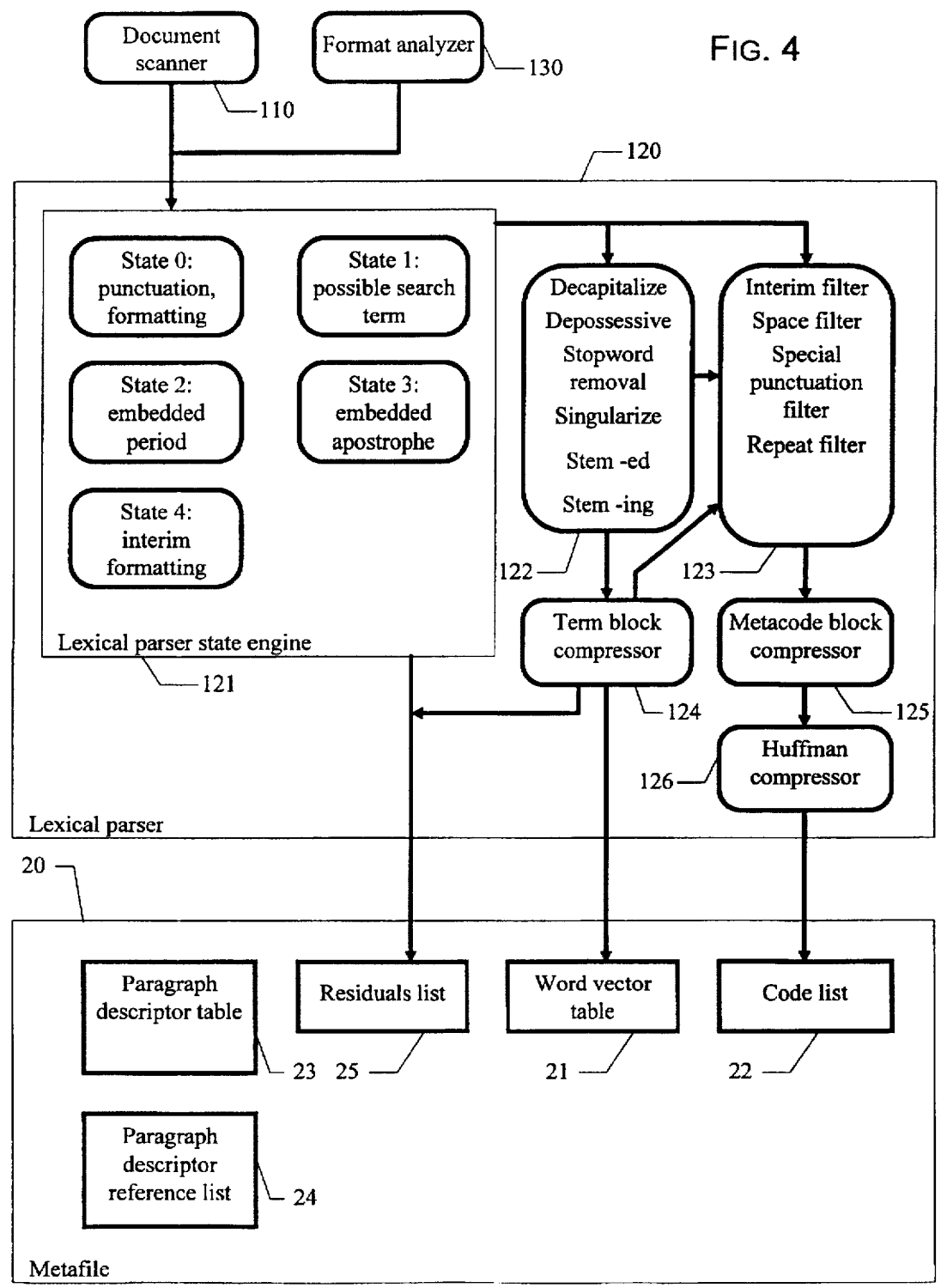
FIG. 4 is a block diagram showing the procedure for lexically parsing a document.

Referring now to FIG. 4, the output from the scanner 110 and the format analyzer 130 are passed through the lexical parser's state engine 121. The state engine 121 accumulates strings of characters or codes that represent either potential search terms or the punctuation/formatting information between two search terms (this information will be called a "metacode string"). Preferably, the state engine 121 accumulates search terms and metacode strings in a term buffer and a code buffer, respectively (not shown in FIG. 4 for clarity). Also preferably, the code buffer represents the punctuation/formatting preceding the term contained in the term buffer. The state engine 121 may accumulate more than one search term in a row—that is, it may accumulate a search term, process it (as described below), and then accumulate another search term, and so on—but it may not accumulate and then process more than one metacode string in a row. (Since metacode strings represent all of the punctuation and formatting information between two search terms, by definition, no more than one metacode string exists between two search terms.) Together with the term and code buffers, the state engine 121 also maintains a position counter (not shown) which is incremented as each new term or metacode string is read.

The state engine 121 is preferably constructed as a deterministic finite automation (DFA), a technique well known in the prior art, which transitions between discrete states when certain characters or codes are received from the scanner 110 or format analyzer 130. For example, as shown in FIG. 4, the state engine 121 is accumulating punctuation or formatting information when it is in "state 0." If it receives alphanumeric characters, it will send the already accumulated information on to be processed (as a metacode string), and then transition to "state 1," where it anticipates reading a potential search term. (The transition arcs joining the states shown in FIG. 4 are not shown, for clarity.)

In the preferred embodiment, states 2 and 3 are specialized forms of state 1, which are designed to handle potential search terms having embedded or trailing periods (e.g., "U.S.") or embedded apostrophes (e.g., "they're"), which would otherwise shift the state engine 121 back into state 0. It is preferable that a search term include any embedded periods—periods that are surrounded on both sides by alphanumeric characters—and that if, and only if, an embedded period is present in a term, the term also include its trailing period. This system most appropriately accommodates typical abbreviations, and enhances storage efficiency. It is likewise preferable that search terms include embedded apostrophes, to accommodate contractions.

State 4 deserves special mention. As noted above, the lexical parser 120 ignores the paragraph formatting of the original document (its carriage returns, tabs, indents, margin changes, etc., and often spaces, as well) in favor of the compact, and possibly altered, paragraph formatting generated by the format analyzer 130. For this purpose, the state engine 121 checks the format analyzer's paragraph style reference list 136 to determine when new paragraphs begin. When the reference list 136 indicates that the beginning of a new paragraph has been reached, the state engine 121 shifts into state 4, and ignores any spaces or paragraph formatting codes sent by the scanner 110 until fresh alphanumeric or punctuation characters are received, shifting it into states 0 or 1. However, state 4 presents an interesting problem: in line-delimited documents, the end-of-line delimiter and surrounding spaces will be ignored, resulting in the possible concatenation of the last word from the previous line with the first word of the next line. For this reason, the state engine 121 inserts a special interim metacode into the accumulating string of characters when the engine 121 enters state 4. The lexical parser's interim filter (described below) will later remove the interim code, and replace it with zero, one, or two spaces, as necessary to represent appropriately the space between words within a sentence or across the end/beginning of a sentence.

Information that is characterized by the state engine 121 as a potential search term is transferred to a set of term transformation functions 122, as shown in FIG. 4. The transformation functions 122 operate in the following sequence. First, a decapitalization function determines whether the term in buffer contains capital letters. If it does, the decapitalization function decapitalizes the term (i.e., converts it to all lowercase letters), and appends a recapitalization metacode to the code buffer. In the preferred embodiment, there are three recapitalization metacodes (see Table 2, above): caps, which causes only the term's first letter to be capitalized (except that, for words with embedded periods, caps also causes each first letter following a period to be capitalized); allcaps, which causes all of the term's letters to be capitalized; and specialcaps, which causes any of the first sixteen letters of the term to be capitalized. (When the decapitalization function adds a specialcaps metacode to the code buffer, it also adds a two byte flag to the residuals list 25. Each bit in the flag indicates whether the corresponding letter of the term is capitalized or not.)

Next, a depossessive function determines whether the term in the term buffer has an "'s" suffix. If it does, the depossessive function removes the suffix from the term, and appends a possessive metacode to the code buffer.

Next, a stopword removal function determines whether the term in the term buffer is a stopword. If it is, the stopword removal function clears the term buffer, and appends a metacode representing the stopword to the code buffer.

Next, a singularization function determines whether the term in the term buffer is a plural inflection. If it is, the singularization function converts the term to its singular lemma, and appends a plural metacode to the code buffer. (Of course, this function also accounts for the regular present tense—third person singular inflection of verbs.) The singularization function of the preferred embodiment is designed for reversibility, not necessarily accuracy. Rather than treat it here, the singularization function is described in more detail in Section VII, below.

Next, an -ed stemming function determines if the term in the term buffer is a regular past tense or past participle inflectional form (i.e., it has an "-ed" suffix). If it is, the -ed stemming function converts the term to its lemma, and appends a plusEd metacode to the code buffer. Like the singularization function, the -ed stemming function is designed primarily for reversibility, and not necessarily accuracy. It is treated in more detail in Section VIII, below.

Finally, and only if the -ed stemming function did not alter the term, an -ing stemming function determines if the term in the term buffer is a regular present participle inflectional form (i.e., it has an "-ing" suffix). If it is, the -ing stemming function converts the term to its lemma, and appends a pausing metacode to the code buffer. Like the -ed stemming function, the -ing stemming function is designed primarily for reversibility, and not necessarily accuracy. It is treated in more detail in Section VIII, below.

The fully transformed term (assuming it was not a stopword, and therefore has survived the stopword removal function) is then passed on to a term block compressor 124 and block compressed. The details of the block compression process are described more fully in Section VI, below; for now, it is only important to understand that the term block compressor 124 creates a compressed representation of the search term in the term buffer, and that only the first few significant bytes of this compressed representation will be stored in the metafile's word vector table 21. These first significant bytes are termed a dword (from "dictionary word"). In the preferred embodiment, the lexical parser 120 stores up to six bytes of the compressed search term in the metafile's word vector table 21. If the compressed search term contains more than six bytes, the lexical parser 120 stores the extra bytes (a word completion code) in the metafile's residuals list 25, and then appends a resid metacode to the code buffer. Of course, as mentioned above, the compressed terms are only stored uniquely—that is, if the term is already found in the word vector table 21, it is not added again. In any case, however, the state engine 121 adds the term's current fuzzy position (as measured by the position counter) to the term's position list in the word vector table 21, and then increments the position counter. Note that the position list for each search term in the word vector table 21 is maintained in an ascending order.

Information that is instead characterized by the state engine 121 as punctuation/formatting information is passed to a set of code transformation functions 123, as shown in FIG. 4. The transformation functions 123 perform general clean-up operations on the metacode string in the code buffer. The first function to operate is an interim metacode filter, which scans the metacode string in the code buffer for interim metacodes added by the state engine 121 while in "state 4," as described above. The interim metacode indicates that the state engine 121 ignored the document's original formatting codes, such as carriage returns, tabs, and spaces, while it accumulated the current metacode string, an event that typically occurs when successive lines of a line-delimited document 10 have been "merged" by the format analyzer's 130 line merge function 134 into a single paragraph. The interim filter checks the metacodes surrounding the interim metacode and replaces the interim metacode with (1) nothing, if a hyphen metacode precedes it; otherwise (2) two space metacodes, if end-of-sentence punctuation metacodes (e.g., a period, exclamation point, question mark, or colon, optionally followed by closing quotations, parentheses, or brackets) precede it, and the first character of the next word (the term currently in the term buffer) is capitalized; and otherwise (3) one space metacode. In this manner, the interim filter attempts to place the correct number of spaces between the last word of the previous line and the first word of the following line.

Next, a space filter replaces any string of n or fewer contiguous space metacodes with a single space metacode. The purpose of the space filter is to convert documents having irregular horizontal spacing-the most common examples of these are line-delimited documents that have been left-and-right justified by inserting extra spaces into each line so that the right margins of each line are flush—into text having a more regular spacing. The result is a reproduced document having more natural looking text, and increased storage efficiency. In normal operation, it is preferred that n, the space filter threshold, be five spaces. Larger sequences of spaces probably represent an intentional effort by the author of the document 10 to place text at a certain position, as in a table.

Next, a special punctuation filter translates some punctuation sequences in the metacode string in the code buffer into other, preferred punctuation metacodes. In the preferred embodiment, the special punctuation filter (1) translates sequences of two to four hyphen metacodes into a single "emdash" (—) metacode; (2) translates combinations of three alternating spaces and periods into a single "three period ellipsis" ( . . . ) metacode; and (3) translates combinations of four alternating spaces and periods into a single "four period ellipsis" ( . . . . ) metacode.

Finally, a repeat filter scans the metacode string in the code buffer for repeating series of n or more metacodes. (In the preferred embodiment, n is five.) If found, the repeat filter replaces the series with a repeat metacode followed by the metacode to be repeated. The repeat filter also stores in the metafile's residuals list 25 a single byte indicating the number of times the metacode is to be repeated.

The fully filtered metacode string is then block compressed by a metacode block compressor 125 (the details of the block compression process are described in Section VI, below). Next, the lexical parser 120 increments the position counter by the number of byte in the block compressed string, to account for the "positions" occupied by the code. Finally, the block compressed metacode string is passed to a Huffman compressor 126, which compresses the metacode string and then appends the compressed string to the metafile's code list 22. (The Huffman compressor 126 is also described in more detail in Section VI. below.)

Information from the document 10 that is not characterized by the state engine 121 as a search term or punctuation/formatting information is sent directly to the metafile's residuals list 25, as shown in FIG. 4. In the preferred embodiment, the only information sent directly from the state engine 121 to the residuals list 25 is the type of word emphasis that accompanies a format on/off metacode. The state engine 121 sends a single byte code to the residuals list 25 that represents, in its lower three bits, which types of word emphasis (underline, boldface, and/or italics) are to be toggled. In other embodiments. of course, it is possible that the state engine 121 could pass on to the residuals list 25 information such as embedded graphics, hypertext links, and more advanced formatting information.

For illustration purposes, Table 5 below shows the output of the lexical parser 120 for a short sample text. The paragraph descriptor codes are listed following the "PDC" tag; search scans appear as normal text, and metacodes are bracketed. The underscore separating search terms indicates that there is a space between the words, but simple spaces between words are never output by the lexical parser 120, nor stored in the metafile 20. Note also that the spaces between stopwords and search terms, or other stopwords, are also not stored. These spaces are instead regenerated during the expansion process (described below), whenever two words would otherwise be adjacent.

table 21 having a unique list of up to the first six significant bytes of each block compressed search term in the document 10, together with the fuzzy positions in the document 10 that those terms occupy; (2) a code list 22 that contains Huffman encoded, block compressed metacodes, which describe, in order of occurrence, all of the punctuation, formatting, stopwords, and morphological transformations that occur between every search term; (3) a paragraph descriptor table 23 and paragraph descriptor reference list 24 that together describe the paragraph format (margins, leading, justification, first line indent, and capitalization) of every paragraph in the document 10; and (4) a residuals list 25 that contains, in order of occurrence, miscellaneous information about the document 10 such as word emphasis types, repeat counts, and word completion codes.

IV. The Archive Structure

Figure 5:
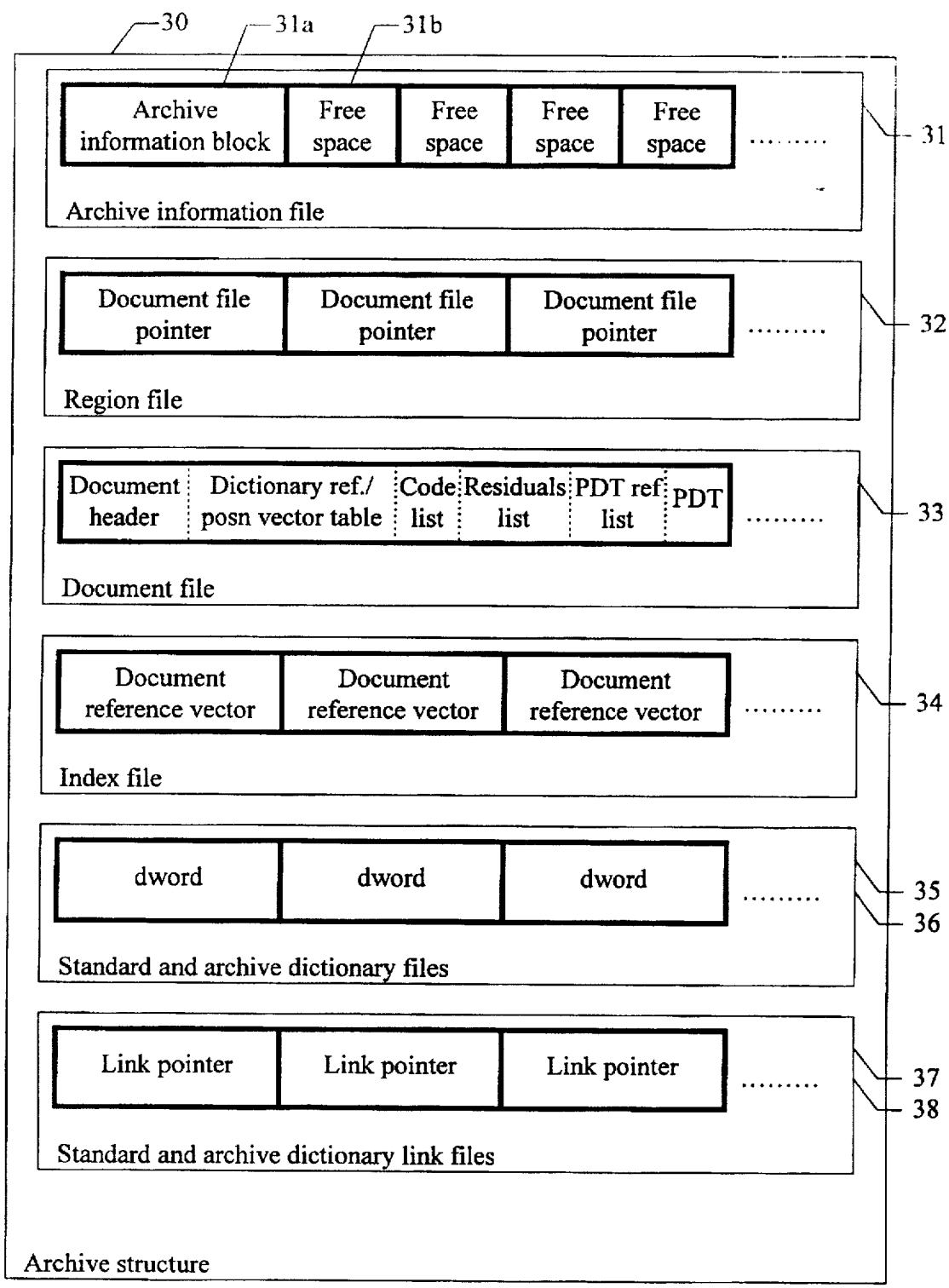
FIG. 5 is a block diagram showing the substructures of an archive.

The archive structure 30 created by this invention is intended to reside in fixed storage, such as on a hard disk drive or CD-ROM. It comprises eight separate substructures, stored as separate files. Some of these substructures may be merged together in a single file located on the storage device. For purposes of this discussion, however, it is easier to consider each substructure as a separate file. FIG. 5 shows the substructures, or files, of the archive 30. Table 6, below, describes the contents of each file.

TABLE 5

An Unexpected Party

In a hole in the ground there lived a hobbit. Not a nasty, dirty, wet hole, filled with the ends of worms and an oozy smell, nor yet a dry, bare, sandy hole with nothing in it to sit down on or to eat; it was a hobbit-hole, and that means comfort.
[PDC:1 L:020 R:150 F:000 PL:1 SL:0 FO:0 Center]
[cap] [an] [cap] [plusEd] unexpect [cap] party
[PDC:2 L:020 R:150 F:000 PL:1 SL:2 FO:0 Left]
[cap] [in] [a] hole [in] [the] ground [there] [plusEd] live [a] hobbit [.] [cap] [not] [a] nasty [,] dirty [,] wet_hole [,] [plusEd] fill [with] [the] [plural] end [of] [plural] worm [and] [an] oozy_smell [,] [nor] yet [a] dry [,] bare [,] sandy_hole [with] [plusing] noth [in] [it] [to] sit_down [on] [or] [to] eat [;] [it] [was] [a] hobbit [-] hole [,] [and] [that] [plural] mean_comfort [.]

At the end of the lexical parsing and format analysis processes, then, the metafile 20 contains (1) a word vector

TABLE 6

1. Archive information file 31—contains an archive information block 31a which records general information about the archive 30, such as the number of documents stored in the archive and compression ratios; and a list of "free space markers" 31b which identify free spaces in the index file 34.
2. Region file 32—contains a list of pointers which identify the beginning of each document in the document file 33.
3. Document file 33—contains the documents of the archive, stored as compressed metafiles.
4. Index file 34—contains document reference vectors for every search term in the archive dictionary 36, and those search terms in the standard dictionary 35 that are found in the archive 30.
5. Standard dictionary file 35—contains a list of unique search terms, stored as dwords, commonly found in documents 10. In the preferred embodiment, the standard dictionary 35 contains approximately 3000 common business, legal, and technical terms, such as "interest," "man," "new," "reason," "said,"

TABLE 6-continued

"statement," and "within."

6. Archive dictionary file 36—contains a list of all unique search terms (other than those already in the standard dictionary 35), stored as dwords, found in the documents contained in the archive 30.
7. Standard dictionary link file 37—contains a pointer to the index file 34 for each search term in the standard dictionary file 35.
8. Archive dictionary link file 38—contains a pointer to the index file 34 for each search term in the archive dictionary file 36.

V. Adding a Metafile to the Archive

Figure 6:
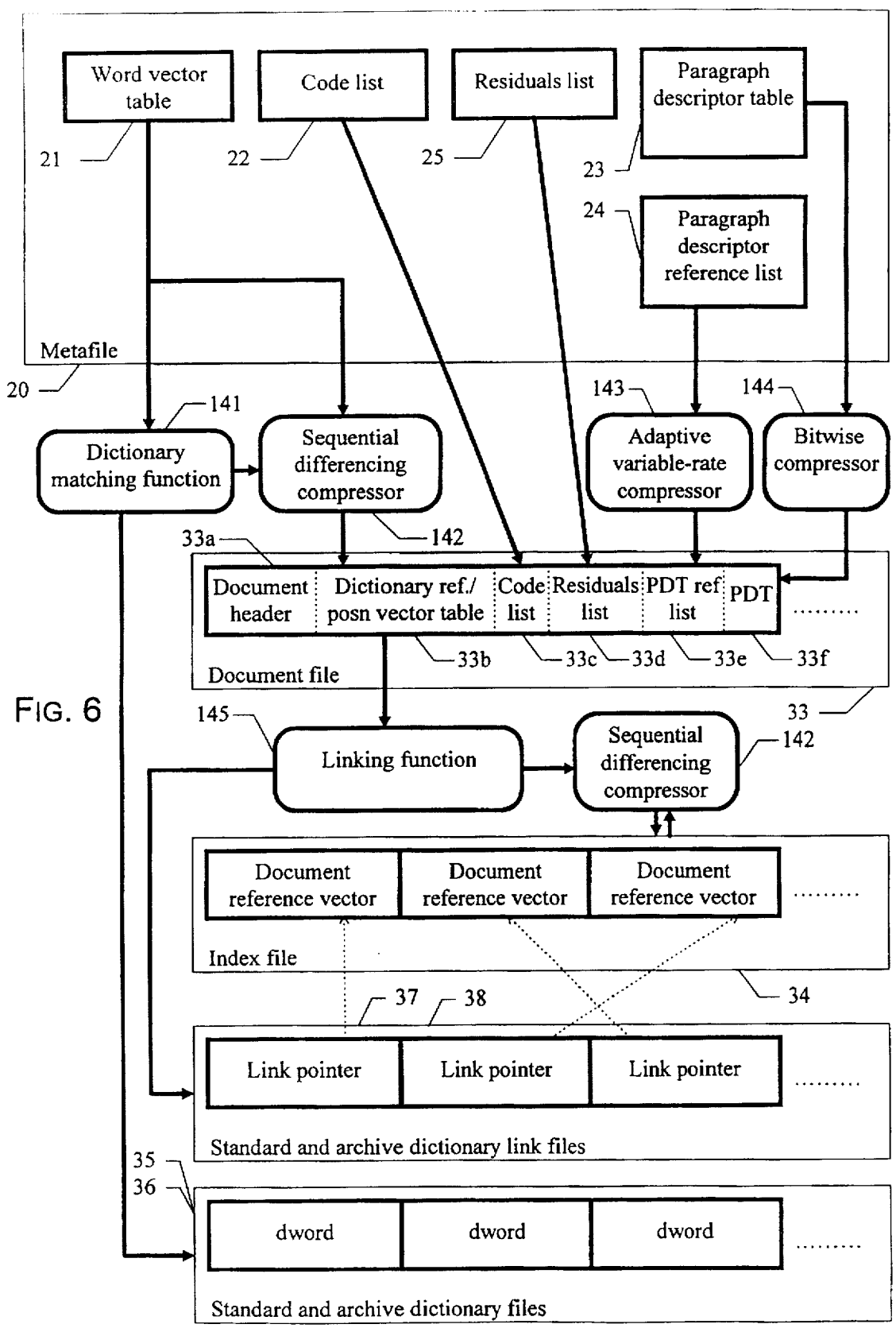
FIG. 6 is a block diagram showing the procedure for adding a metafile to the archive.

FIG. 6 illustrates the procedure for adding a metafile 20 to the archive 30. Briefly described, the metafile's word vector table 21 is matched against the archive's two dictionaries 35, 36, and then compressed and appended to the document file 33. The rest of the metafile 20 is then compressed and appended to the document file 33, as well. Next, the document's serial number is added to the archive's index file 34 for each search term in the word vector table 21. Finally, the archive information file 31 is updated to reflect the addition of the new document 10.

A. Storing the Metafile in the Document File

Before the metafile 20 representation of a document 10 is added to the archive, a short, blank document header 33a is appended to the document file 33. The header 33a will later be filled with information about the document 10, but because this information is not yet available, the header 33a is written simply as a placeholder.

Next, a dictionary matching function 141 compares the dwords stored in the metafile's word vector table 21 to the list of dwords stored in the standard and archive dictionary files 35, 36. If a match is found, the dictionary matching function 141 replaces the dword in the word vector table 21 with a reference to the dictionary entry containing the dword. If a match is not found, the matching function 141 adds the dword to the archive dictionary 36, and then replaces the dword in the word vector table 21 with a reference to the new dword in the dictionary 36. During the dictionary matching process, the word vector table 21 is maintained in a sorted, ascending order, according to the magnitude of the dictionary references. Furthermore, dictionary references are preferably four bytes long, giving the dictionaries a combined potential range of over four billion words.

The partially transformed word vector table 21 (now containing references to the dictionaries 35, 36 instead of dwords) is then passed through a sequential differencing compressor 142. The differencing compressor 142 replaces each dictionary reference with the difference between it and the one before it. Because the dictionary references were maintained in an ascending order, the average magnitude of the new, differenced references will be greatly smaller than that of the original, absolute references. During this replacement process, therefore, the differencing compressor 142 determines the minimum number of bits required to encode the largest differenced reference (the "maxbits" of the list of references).

As shown in FIG. 6, the differencing compressor 142 also operates on the fuzzy position list stored with each search term in the word vector table 21, performing the same function of replacing each fuzzy position in the list with the difference between it and the one before it, and determining the minimum number of bits required to encode the largest differenced position in the list (the "maxbits" of the list). Because the number of positions in each list (the "list count") must also be stored along with the list, however, the differencing compressor 142 uses an optimized method to encode the count and the positions together. Table 7, below, describes the system followed in encoding the fuzzy position lists.

TABLE 7

1. If the list contains only one reference, magnitude less than 32768, encode as a "1" bit, followed by the position stored in fifteen bits.
2. If the list count is three or less, encode as a "0" bit, followed by the count stored in two bits, then the maxbits stored in four bits, then the list of differenced references stored in maxbits bits.
3. If the list count is between four and ten, encode as three "0" bits, followed by the count minus three stored in three bits, then the maxbits stored in four bits, then the list of differenced references stored in maxbits bits.
4. If the list count is between eleven and 1033, encode as six "0 " bits, followed by the count minus ten stored in ten bits, then the maxbits stored in four bits, then the list of differenced references stored in maxbits bits.
5. In all other cases, encode as the count minus 1033 stored in thirty-two bits, then the maxbits stored in four bits, then the list of differenced references stored in maxbits bits.

The differencing compressor 142 then creates the archive's dictionary reference/position vector table 33b by writing in the document file 33 each differenced dictionary reference (stored in maxbits) and its position list (stored as described above in Table 7).

To increase search efficiency, however, it is preferable that the dictionary reference/position vector table 33b be written in two partitions: the list of dictionary references and positions for terms found in the standard dictionary 35, followed by the list of dictionary references and positions for terms found in the archive dictionary 36. In the preferred embodiment, then, the sequential differencing compressor 142 creates two separate dictionary reference/position vector tables 33b, one for each dictionary 35, 36, and calculates the maxbits for each set of differenced dictionary references separately.

Next, the code list 22 and residuals list 25 are appended to the document file 33, as shown in FIG. 6. Because the code list 22 is already fully compressed, it needs no further processing before final storage in the archive 30. Likewise, because the residuals list 25 is likely to contain highly random, and therefore poorly compressible, information, and is in any case a relatively small structure, it need not be compressed. Of course, in an implementation of this invention in which much information is stored in the residuals list 25 (such as hypertext linking or embedded graphics), it may be desirable to process the residuals list 25 with a compression algorithm before storing it in the archive 30.

Next, the metafile's paragraph descriptor reference list 24 is passed through an adaptive variable-rate encoding compressor 143 and appended to the document file 33. The adaptive variants of variable-rate compressors, such as the Lempel-Ziv algorithms, are well known in the art; implementations of these algorithms are publicly available on the Internet. The preferred embodiment uses an adaptive Huffman variant of the Lempel-Ziv algorithm, based on the well known public domain implementation coded by Haruhiko Okumura and Haruyasu Yoshizaki.

Next, the metafile's paragraph descriptor table (PDT) 23 is passed through a bitwise compressor 144 and appended to the document file 33 following the paragraph descriptor reference list 24. The bitwise compressor 144 simply stores each paragraph descriptor code contained in the PDT 23 as the compact structure described below in Table 8.

for each new document. To facilitate immediate access to a given document by number, the archive's region file 32 stores a sequential list of pointers to the beginning of each document's header 33a in the archive's document file 33. Thus, once a document's archive representation has been completely written into the document file 33, the location of its header is appended to the region file 32.

B. Indexing the Metafile

To enhance keyword searches of the archive 30, an inverted index file 34 is kept which, as diagrammed in FIG. 5 and noted above in Table 6, contains document reference vectors for those search terms in the standard dictionary 35 that are found in the documents in the archive 30, and for all of the search terms in the archive dictionary 36 (which, by definition, are found in documents in the archive 30). These reference vectors are sorted lists of serial numbers indicating which document(s) contain a particular term (together with a count record that indicates how many documents contain that term). To speed access to the index file 34, the standard dictionary link file 37 and the archive dictionary link file 38 contain pointers to the index file 34 which parallel the dword entries in their respective dictionaries 35, 36. Thus, as shown schematically in FIG. 6, each link pointer in the link tiles 37, 38 indicates the position of the document reference vector for that term.

Because documents 10 will be periodically added to the archive 30, the document reference vectors in the index 34

TABLE 8

1. Left margin—one byte, representing the distance from the left edge of the page measured in 20ths of an inch.
2. Right margin—one byte-representing the distance from the right edge of the page measured in 20ths of an inch.
3. First line indent—one byte, representing the distance from the left edge of the page measured in 20ths of an inch.
4. Primary leading—four bits representing the vertical space between lines in a paragraph, measured in eighths of a line, based at one line. For example, a primary leading of zero indicates single spacing; a primary leading of four indicates one-and-a-half line spacing; a primary leading of eight indicates double spacing.
5. Secondary leading—four bits representing the number of blank lines between paragraphs. A secondary leading of zero indicates that the paragraph begins on the same line as the preceding paragraph began (as in columns and tables). All other values are measured between the last line of the preceding paragraph and the first line of the current one.
6. Justification—two bits indicating whether the paragraph is left, right, or center justified.
7. Format—one bit indicating whether the paragraph is displayed in all capital letters.
8. Reserved—five bits.

Finally, the document header 33a is rewritten, this time containing (1) the fuzzy position of the last search term in the document 10; (2) the maxbits size for the differenced dictionary references in the two tables 33b; and (3) the distance, in bytes, from the start of the first dictionary reference/position vector table 33b (for the standard dictionary 35 ) to the start of the second dictionary reference/ position vector table 33b (for the archive dictionary 36). In addition, because it is often desirable quickly to provide the user with a list of citations to documents in the archive 30, the document header 33a contains a short citation, stored as plain text, which identifies the document 10 (usually by title and/or author).

At this point, the document 10 is assigned a serial number, so that it may be rapidly retrieved, and also easily referenced by the archive's index file 34, which will be discussed below. The serial numbers of documents in the preferred embodiment are numbered from zero, and increment by one will grow randomly. In addition, new document reference vectors will be added to the index 34 as new terms are encountered in documents 10. It is therefore preferable that the index 34 be structured as a free heap, a structure well known the prior art. A list of free space markers 31b, which indicate free regions within the index heap 34, is stored at the end archive's information file 31, as shown in FIG. 5. As new reference vectors must be added to the index 34, they are allocated space marked by the free space marker list 31b first; but if no space is available within the heap 34, then the reference vector is appended to the end of the index file 34. Similarly, when an existing reference vector must grow beyond its allocated space (because a new document reference must be added to it), it is moved to the first accommodating available space within the heap, or to the end if no such space is available, and its original location marked as free in the free space marker list 31b. Of course, whenever a reference vector is added or moved, the pointer to its location must be updated in the relevant link file 37, 38.

As shown in FIG. 6, therefore, a linking function 145 scans the dictionary references from the archive's dictionary reference/position vector table 33b. The linking function 145 adds new pointers to the link files 37, 38 for new terms in the archive 30 (i.e., those terms which were not already listed in the dictionaries 35, 36), and updates the document reference vectors for each term, both old and new, by adding to each reference vector the serial number assigned to the current document 10.

In the preferred embodiment, the document reference vectors in the index file 34 are passed through the sequential differencing compressor 142, using the same encoding scheme described for encoding position vectors (see Table 7, above), before storage. The differencing compressor 142 not only improves the storage efficiency of the index 34, but also makes it possible, in many cases, to add a document reference to an existing reference vector without increasing the size of the vector beyond its allotted space.

C. Miscellaneous

Once the metafile 20 has been added to the archive 30 and all its terms indexed and linked, the archive's information file 31 is updated to reflect the number of documents stored in the archive. Information about the archive 30, such as the total size of documents stored in it, or the total number of words processed, may also be stored, and updated, in the archive information block 31a of the information file 31.

As an alternative to adding a metafile 20 to the archive 30, it is also possible for the metafile 20 (or several metafiles) to be compressed as described above, but not added to the archive 30. In this alternative embodiment of the invention, the metafile's word vector table 21 is not matched against the archive dictionary 36. Rather, the search terms in the table 21 are matched against only the standard dictionary 35, and those terms found in the standard dictionary 35 are replaced by references to the standard dictionary 35. In this alternative embodiment, then, the compressed metafile becomes a "transportable" version of the document 10, which can be transferred and used by any system or user which has access to the standard dictionary 35.

VI. Block Compression

In parsing a document 10 to create a metafile 20, the lexical parser 120 employs block compressors 124, 125 to reduce the size of words stored in the archive dictionaries 35, 36, and to reduce the size of metacode strings stored in the metafile's code list 22. Because the block compression technique is not known in the prior art, this section will discuss the technique in detail.

Block compression is a statistically modeled replacement encoding technique that is similar in many respects to known replacement encoding techniques such as Shannon-Fano and Huffman encoding. (See Huffman, David A., "A Method for the Construction of Minimum-Redundancy Codes," Proceedings of the I.R.E., September 1952.) The Shannon-Fano and Huffman schemes replace the individual bytes of a string with codes whose lengths are proportional to the frequency of occurrence the individual bytes. Block compression, by contrast, replaces commonly occurring substrings of a string with fixed length codes. Where the fixed length code is byte- or word-sized, both compression and decompression are extremely fast because partial byte operations are not required.

Figure 7:
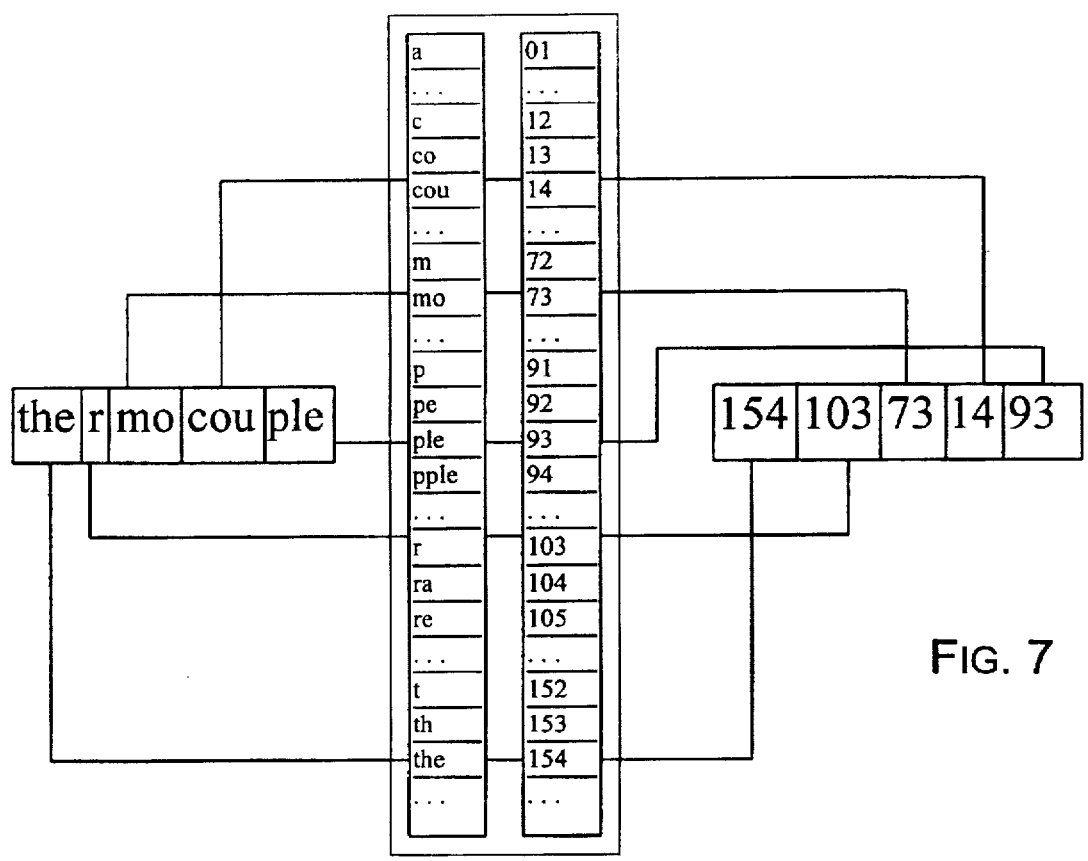
FIG. 7 is a block diagram showing the procedure for block compressing a search term.

The substrings to be replaced are stored in a block list 300, shown schematically in the middle of FIG. 7. Compression is accomplished by scanning the input string for substrings found in the block list 300, and constructing an output (compressed) string composed of the fixed length codes associated with each substring. For speed, it is desirable that the input string be scanned from left to right for the longest matching substring in the block list 300; when a match is found, the code associated with that substring is appended to the output string, and scanning begins again at the input character following the matched substring. For example, FIG. 7 shows the compression and decompression process for the input string "thermocouple." The longest substring in the block list 300 matching the beginning of "thermocouple" is the substring "the"; its code (154) is therefore appended to the output string, and scanning begins again at the letter "r" in the input string. The process is then repeated until the entire input string has been scanned. Decompression is performed by simply replacing each code with the substring that it represents.

The block list 300 is generated by scanning a very large list of common input strings to determine which substrings are most commonly repeated in the list. The most common substrings are then ranked by value, where a substring's value is equal to its frequency of occurrence multiplied by its length in bytes. The highest valued substrings are then placed in the block list 300. In addition, to ensure that every possible input string can be encoded by the block list 300, the block list 300 must also include every individual character in the alphabet of possible characters in the input strings.

A better selection of substrings for the block list 300 can be made by taking into account the complementary phenomena that (1) when a long string is selected for membership in the block list 300, shorter strings already in the list 300, which are substrings of the longer string, will have a lower value because the longer string will be now be used for replacement instead of the shorter strings; and (2) when a short string is selected for the block list 300, longer strings already in the list 300, of which the shorter string is a substring, will have a lower value because the longer strings now replace an input string which can already be more efficiently encoded, in part, by the shorter string. Because of these phenomena, it is likely that for any reasonably sized list of input strings an optimal selection of substrings for the block list 300 is impossible to calculate in reasonable time. However, a near optimal solution can be found by iteratively rescanning the list of input strings, using the block list 300 developed in the previous iteration.

It is also desirable to use a second-order block list (a "block table"), having a separate list of substrings for each "position" within the input string. That is, during compression the input string is matched against a first block list; after its first substring is removed (and its code appended to the output string), the remainder of the input string is then matched against a second block list (not shown in FIG. 7), and so on. The process is repeated using different block lists until the entire input string is encoded, or until the block compressor runs out of lists. At that point, the last list can be used again and again until the input string is exhausted.

Figure 8:
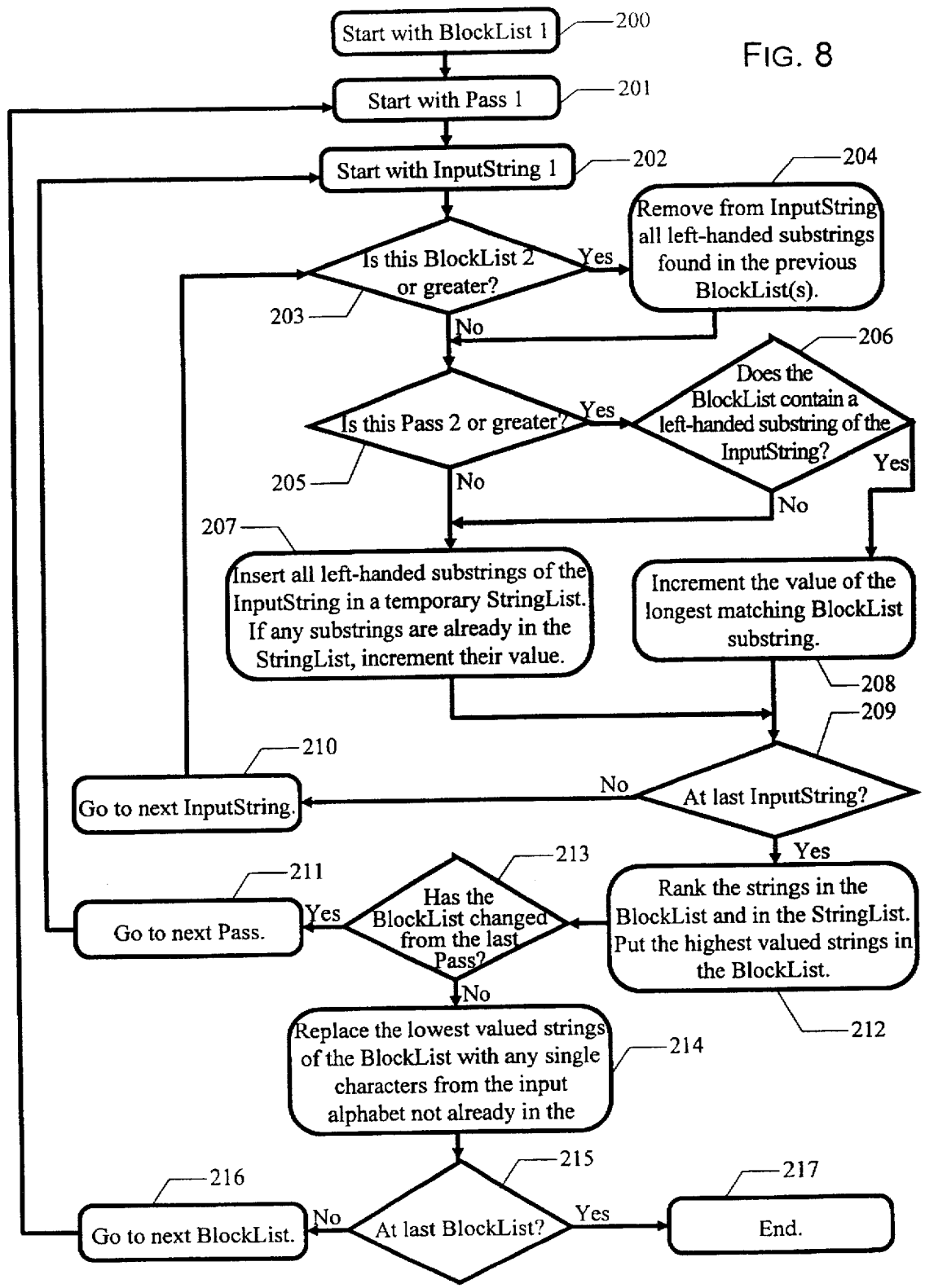
FIG. 8 is a block diagram showing the procedure for generating block tables for the block compressors used in the preferred embodiment.

FIG. 8 describes the block list generation procedure of the preferred embodiment, which uses second-order block lists generated by the iterative technique described above. Beginning at steps 200–201, the first block list is initialized (empty) and a pass counter is set to 1. Also at step 201, the values for all substrings in the current block list are reset to zero. The list of input strings is then initialized (reset to the first string) at step 202. For the first block list on the first pass, steps 203–206 are skipped; the initial block list is generated by inserting into a temporary string list, at step 207, every left-handed substring of each input string. (The left-handed substrings of the word "apple," for example, are "a," "ap," "app," "appl," and "apple." Because it is unlikely that very long substrings will ultimately be selected for the block list, it is practical at this stage to omit to add substrings beyond a threshold length. For example, when creating a block list to compress English words, very rarely will a substring of eight or more letters occur with sufficient frequency to warrant membership in the block list. Longer substrings can therefore be safely ignored.) Substrings are entered into the string list, and their values (frequency of occurrence multiplied by length) tallied, during step 207. When all of the input strings have been processed, the substrings are sorted by value, and the highest valued substrings entered in the current block list, at step 212. For the first pass, step 213 is ignored (because there is no previous pass to compare with), the pass counter is incremented at step 211, and the process repeats at step 202 by initializing (resetting to the first string) the list of input strings.

For the second and later passes, each input string is first tested, at step 204, against the current block list (which was generated in the previous pass). If the block list contains a left-handed substring of the input string (e.g., if the input string is "apple," and the current block list already includes the string "app," step 204 evaluates to yes), then the value of the longest matching substring in the block list is incremented, at step 208. (In this way, the substrings of the current block list are valued preferentially over all other substrings; this procedure also speeds the block list generation process.) If, on the other hand, the current block list did not contain a left-handed substring of the input string, then all of the input string's left-handed substrings are added to the string list, as before, at step 207. (Note that the temporary string list must be flushed at the beginning of each new pass, at step 201.) At the end of this process, the values of all substrings in the temporary string list, and from the current block list, are ranked at step 212, and the highest valued substrings, from either source, are placed in the block list. At step 213, the block list is evaluated to determine if it has changed from the last pass (i.e., whether any substrings were changed at step 212). In practice, it is not certain that this iterative approach will converge on a single block list; for this reason, it may be necessary at step 213 to determine merely if the block list has substantially changed; but in generating blocks for both the dictionary block compressor 124 and the metacode string block compressor 125 of the preferred embodiment, the block lists tend to converge on a single solution within five to fifteen passes.

When the block list finally remains unchanged at step 213, the list is then altered to ensure that it contains at least every individual letter from the alphabet of all possible input strings, at step 214. (For example, in the block lists for words in the dictionary of the preferred embodiment, the block lists must have the single letters a–z, the digits 0–9, the period, and the apostrophe.) The process is then repeated, as before, until at step 215 the last block list is reached. (When generating the second or higher block list, however, it is necessary to remove from each input string the substrings of previous block lists. So, for example, where the input string is "apple," and the first block list has the substring "app," the input string becomes "le.")

The list of input strings must be large, and sufficiently representative of all input strings to be encoded in practice, to generate effective block tables. In the preferred embodiment, the lexical parser 120 was used scan a 70 megabyte corpus of pure text, generating a list of approximately 100,000 unique words (after decapitalization, stopword removal, and morphological transformation, as described above) that would potentially be stored in the archive's dictionaries 35, 36; and a list of several hundred thousand non-unique metacode strings that would potentially be stored in the code lists 33c of documents in the archive's document file 30. These lists were used to generate the block tables of the term block compressor 124 and metacode block compressor 125 of the preferred embodiment.

Compression efficiency for the dictionaries approaches, on average, that of the Huffman technique. However, while block compression produces longer codes than the Huffman technique for short input strings, it produces smaller codes for long input strings—a result that is ideal for fixed-length storage, such as in the archive's dictionaries 35, 36.

In addition, block compression produces an output string having a smaller number of integral "units" (the fixed length codes) than the original input string. Thus, for example, a twelve-letter input string such as "thermocouple" (see FIG. 7) might transform to an output string having five codes. Compare this with the Huffman encoding technique, which would produce an output string measured in bits, having perhaps thirty-five to forty-five bits, or at best in encoded letters, in which case the Huffman code has twelve letters (the same as the input string). Block compression is thus ideal for storing the metacode strings between search terms, because the number of "fuzzy positions" required by the compressed metacode string is minimized—improving the accuracy of position information stored in the metafile's word vector table 21.

Finally, block compression achieves higher compression for strings formed of long but common substrings—such as words formed of long but common English prefixes or suffixes—at the expense of decreased compression for complex, but usually shorter, strings—such as nonsense words, codes, and abbreviations. Thus, search terms such as anthropology and determination block compress more effectively than search terms such as int'l and xr4ti. This aspect of block compression is highly advantageous for keyword storage structures such as the dictionaries 35, 36 of the preferred embodiment, where the entire length of a common keyword must be stored, to distinguish it from other words, but where only the first few characters of a nonsense word need be stored to distinguish it from others. For example, the block compressed strings for anthropology and anthropological probably differ in the fifth or sixth bytes; similarly, the block compressed strings for xr4ti and xr4tzx also probably differ in the fifth or sixth bytes. Thus, the same number of bytes are required to distinguish the two types of words from other, similar words—a result that is also ideal for fixed-length storage structures.

The number of substrings in each block list, and the depth of the block table (i.e., the number of lists), is a matter of design choice which will depend on the type of input strings to be encoded. The block table for the term block compressor 124 has, in the preferred embodiment, six block lists, and each list has 256 substrings—which eliminates the need for partial byte operations, since each fixed length block code is therefore exactly one byte. The block table for the metacode string block compressor 125 has, in the preferred embodiment, four block lists, and each list has 512 substrings; the odd bit size (9 bits per code) has no effect on speed because, as noted above (and described below), the metacode string block compressor 125 is coupled to a Huffman compressor 126, which already performs partial byte input and output functions for the metafile's code list 22.

The Huffman compressor 126 is based on the well known static Huffman compression technique. In static Huffman compression, each symbol in an input alphabet is replaced with a unique code whose size in bits is inversely proportional to the frequency of occurrence of the replaced symbol. Thus, for example, in a Huffman code for English words, the very common letter x might be replaced by a very short Huffman code, say 010; less common letters such as x might be replaced by a long Huffman code such as 00110110001. In the preferred embodiment, the Huffman codes replace the block codes generated by the block compressor 125. Thus, the Huffman compressor 126 will replace a very common block code, say one representing the substring corresponding to a period, two space metacodes, and a caps metacode—which occurs at the end of most sentences—with a short Huffman code. A less common block code, for example one representing a right parenthesis and a space metacode, would be replaced with a longer Huffman code. To further improve storage efficiency, each block list in the metacode block compressor's 125 block table is assigned a separate Huffman table. The Huffman tables are generated by ranking the usage frequencies of the substrings in the block lists; more frequently used substrings are given shorter Huffman codes.

VII. The Singularization Function

To ensure that text is accurately reproduced, the lexical parser's 120 singularization function must be reversible: that is, if a word is determined to be plural, and then singularized by the function, there must be a complementary pluralization function that exactly reproduces the original word. This goal is more difficult than it at first appears, since many words may be pluralized in more than one way (e.g., zeros or zeroes). If, for example, the word "zeros" is encountered and converted to "zero" by the lexical parser 120, should it be re-stemmed to "zeros" or "zeroes"? For most common words, the problem is merely semantic and may be overlooked; but since text documents frequently include proper nouns, names, and other words which must be accurately respelled, a fully reversible singularization function is highly desirable.

Clearly a dictionary-based function would suffice. Only words in the dictionary of plural words would be singularized; to pluralize them again, the function need only locate the plural in the dictionary, given the singular form. However, dictionary-based methods are cumbersome, requiring at best a hashed search during the critical inner loop of the lexical parser's state engine 121, and likely a large dictionary as well. Moreover, a dictionary-based function would be unable to handle plural proper nouns and other specialized words, such as jargon and abbreviations, commonly found in business, technical, and legal documents.

The preferred embodiment uses a partially rule-based, partially dictionary-based singularization function that is fully reversible. The singularization function divides words based on their endings into several categories of common English plural forms. Only if necessary, one or more of eleven lists of "irregular" singular forms, representing exceptions to the general rules for English singularization, are binary searched for the word. If the word is not present in the irregular lists, it is singularized according to the general rule; otherwise, it is singularized according to the irregular rule. Words not falling into the plural categories are not singularized.

Table 9, below, describes in pseudocode the singularization method of the preferred embodiment. The eleven irregular lists were derived from a study of 130,000 of the most common English words. Words in the SES-to-SIS list, for example, include analyses and neuroses; these words are transformed to analysis and neurosis, rather than analyse and neurose, as the general role would dictate. Words in the CHES-to-CHE list include psyches and quiches; these words are transformed to psyche and quiche, rather than psych and quich as the general role would dictate.

TABLE 9

```
if length <3 then return.
if last letter is:
    s:  if second-to-last letter is:
        e:  if third-to-last letter is:
            s:  if in the SES-to-SIS list, change -ses to -sis,
                else if fourth-to-last letter is:
                    a:  if in the ASES-to-AS list, change -ases to -as,
                        else change -ases to -ase.
                    i:  if in the ISES-to-IS list, change -ises to -is,
                        else change -ises to -ise.
                    o:  if in the OSES-to-OS list, change -oses to -os,
                        else change -oses to -ose.
                    u:  if in the USES-to-US list, and not in the
                        I-to-US list, change -uses to -us,
                        else change -uses to -use.
                s:  change -sses to -ss.
                otherwise, change -ses to -se.
            c:  if in the CES-to-X list, change -ces to -x,
                else change -ces to -ce.
            x:  if fourth-to-last letter is a, change -axes to -axe,
                else if not in CES-to-X list, change -xes to -x,
                else return.
            v:  if in the VES-to-F list, change -ves to -f;
                else change -ves to -ve.
            i:  if in the IES-to-IE list, change -ies to -ie,
                else if fourth-to-last letter is not a vowel,
                change -ies to -y,
                else return.
            o:  if in the OES-to-O list, change -oes to -o,
                else change -oes to -oe.
    h:  if fourth-to-last letter is:
        s:  change -shes to -sh.
```

TABLE 9-continued

```
        c:  if in CHES-to-CHE list, change -ches to -che,
            else change -ches to -ch.
            otherwise, change -hes to -he.
        z:  if fourth-to-last letter is z, and not in
            the ZES to-Z list, change -zzes to -z,
            else if in the ZES-to-Z list, change -zes to -z,
            else change -zes to -ze.
            otherwise, change -es to -e.
    a:  if in the ASES-to-AS list, return,
        else change -as to -a.
    i:  if in the SES-to-SIS or ISES-to-IS lists, return,
        else convert -is to -i.
    o:  if not in the OES-to-O list, change -os to -o,
        else return.
    u:  if third-to-last letter is a, change -uas to -ua,
        else return.
    y:  if third-to-last letter is a vowel, change -ys to -y,
        else return.
    s:  return.
    f:  if in the VES-to-F list, return,
        else change -fs to -f
    h:  if third-to-last letter is c or s, return,
        else change -hs to -h.
    x:  return.
    z:  return.
    n:  if third-to-last letter is a, and
        fourth-to-last leffer is m, return,
        else change -ns to -n.
        otherwise, delete the final -s.
i:  if in I-to-US list and not in USES-to-US list,
    change -i to -us,
    else return.
n:  if second-to-last letter is e,
    and third-to-last letter is m, change -men to -man,
    else return.
otherwise, return.
```

The pluralization method corresponding to the above singularization method is described below in Table 10.

TABLE 10

```
if last letter is:
    s:  if length >2,then
        if second-to-last letter is:
            i:  if in the SES-to-SIS list, change -is to -es,
                else change -is to -ises.
            u:  if in the USES-to-US list, change -us to -uses,
                else change -us to -i.
            otherwise, append -es.
            else append -es.
    o:  if in the OES-to-O list, append -es,
        else append -s.
    y:  if second-to-last letter is a vowel, append -s,
        else change -ys to -ies.
    h:  if second-to-last letter is c or s, append -es,
        else append -s.
    x:  if in the .CBS-to-X list, change -x to -ces;
        else append -es.
    z:  if in the ZES-to-Z list, append -es,
        else append -zes.
    f:  if in the VES-to-F list, change -f to -ves,
        else append -s.
    n:  if second-to-last letter is a,
        and third-to-last letter is m; change -man to -men,
        else append -s.
    otherwise, append -s.
```

VIII. The -Ed and -Ing Stemming Functions

Like the singularization function, the -ed and -ing stemming functions must be fully reversible so that the original text is accurately reproduced. Again, these functions could be implemented using a dictionary of word forms, but such an approach would significantly slow the operation of the lexical parser's critical inner loops. For this reason it is preferable to use rule-based morphological transformations for these functions.

For most regular English past tense, past participle, and present participle inflections, the only significant question to be resolved in forming the word's lemma is whether an e should be appended to the word after the -ed or -ing suffix is removed. In the preferred embodiment, this decision is made by consulting a three-dimensional binary matrix in which the coordinates of each bit in the matrix are the last three letters of the word in question, after the -ed or -ing suffix is removed.

Each bit in the matrix corresponds to a particular triplet word ending, as noted above. If the bit is one, an e should be appended to words having that ending; if zero, it should not. The matrix was generated from a study of 130,000 common English words. The frequencies of words having a particular triplet ending which required an e to be appended were compared with those words having the same triplet ending, but which did not require an e. Bits corresponding to those triplet endings more often requiring an e to be appended are set to one. For example, more words which end in -bit, after the -ed or-ing suffix is removed—such as orbiting or inhabiting—do not require an e to be appended to form the root, than similarly ended words which do, such as biting. The bit in the matrix corresponding to the -bit ending, therefore, is set to zero.

The -ed stemming function also converts words ending in -ied to -y, if the letter preceding the -ied suffix is not a vowel.

Neither function is completely accurate. Note, for example, that in Table 5 the word nothing is stemmed to noth. These inaccuracies are, however, infrequent, invisible to the user, and mostly harmless, except for the addition of an otherwise unnecessary plusEd or plusing metacode. More importantly, however, the functions are exceptionally fast, and fully reversible.

IX. Searching the Archive

Because the archive 30 contains an inverted index of all of the search terms in all of its documents, and because each document contains an inverted index of the positions of all of its search terms, the archive 30 is particularly well adapted to fast keyword searches, including keyword proximity searches. This section describes the search mechanism used with the preferred embodiment of the invention.

Figure 9:
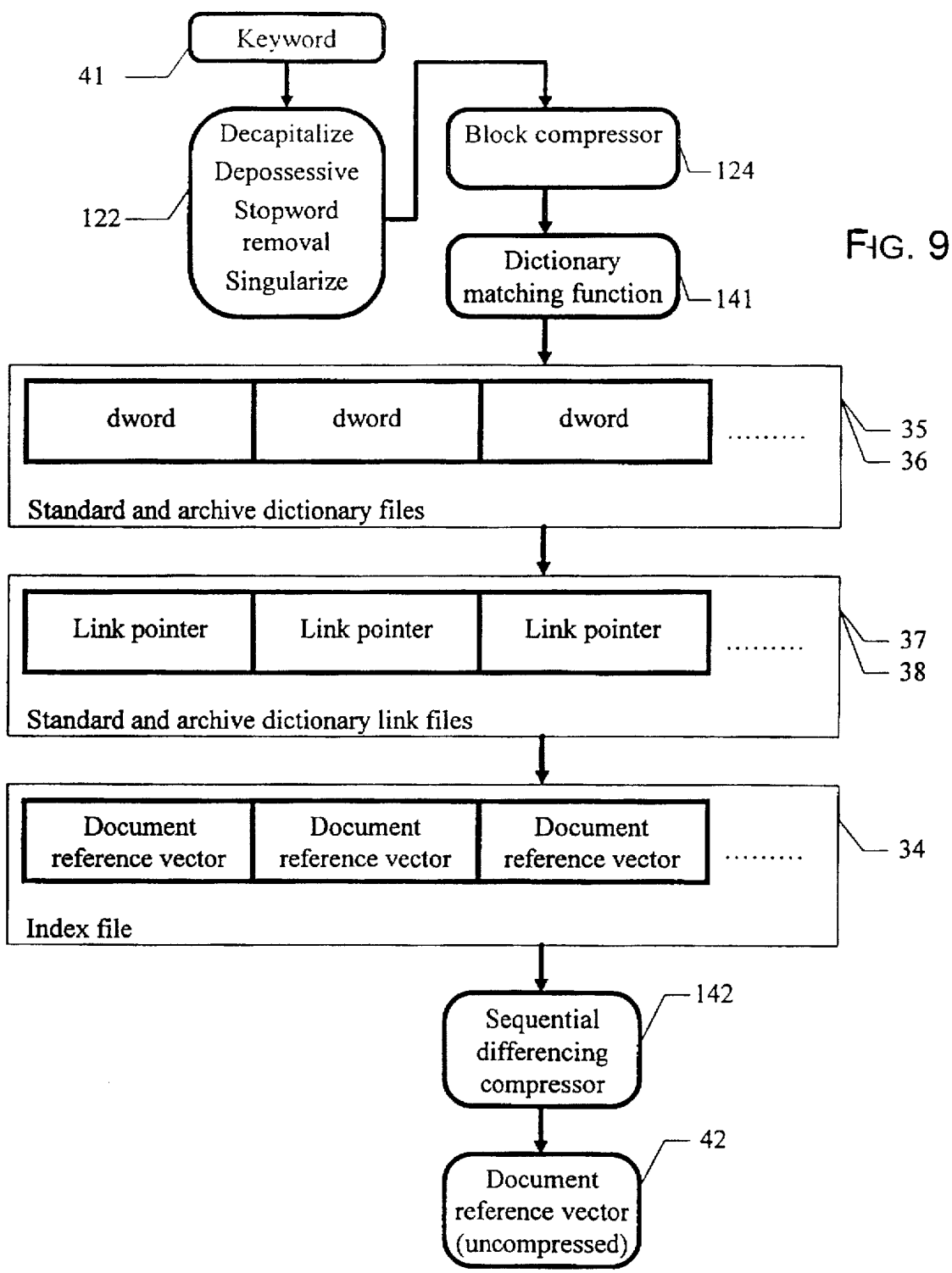
FIG. 9 is a block diagram showing the procedure for performing a pure keyword-in-document search of the archive.

FIG. 9 describes the process used for performing a pure keyword-in-document search. A keyword transformation function (not shown) first processes the keyword 41 using the lexical parser's set of transformation functions 122, to yield a transformed keyword that is the lowercase lemma of the original. (If a stopword is encountered at this stage, the search may be halted and the user informed that the search cannot be performed for that word.) The keyword transformation function then block compresses the transformed keyword using the lexical parser's term block compressor 124, yielding a dword representation of the keyword 41. Any word completion code (i.e., bytes beyond six in the block compressed search term) is discarded.

A keyword search function (not shown) then searches the standard dictionary 35 for the dword, using the dictionary matching function 141. If the dword is found there, the search function checks the standard link file 37 at the location corresponding to the dword's position in the standard dictionary 35 to see if a valid index pointer is there. (Search terms in the standard dictionary 35 which are not found in any document in the archive are assigned invalid index pointers.) If, on the other hand, the dword is not found in the standard dictionary 35, the search function searches the archive dictionary 36 for the dword, again using the dictionary matching function 141, and if it is found there, looks up the corresponding index pointer in the archive link file 38.

If the search function finds a valid index pointer by either means, the search function then invokes the sequential differencing compressor 142 to decompress the appropriate document reference vector 42 from the index file 34. The decompressed document reference vector 42 comprises a list of the serial numbers of all documents in the archive 30 containing the keyword 41.

Because the keyword is transformed to its regular lemma before searching, and because only regular lemmas are stored in the archive's dictionaries 35, 36, the keyword search will retrieve documents containing all regular noun and verb inflections of the keyword, as well. With very few exceptions, regular noun and verb inflections mean nearly the same thing as their lemmas, and for this reason such a result is highly desirable.

More complex searches can be easily performed using a keyword query 40. The keyword query 40 contains a set of keywords, optionally linked by Boolean connectors such as AND, OR, and NOT. The search result for such a keyword query 40 is the result of the pure keyword-in-document search described above, for each keyword, where the resulting document reference vectors are AND-ed, OR-ed, or NOT-ed together, as necessary. For instance, to search for documents containing "men AND women," the reference vectors retrieved for "men" and "women" are AND-ed together to yield a reference vector listing all documents containing both "men" and "women." (Note that because each keyword is converted to its lemma, the keywords that are actually searched are "man" and "woman," which will retrieve all documents containing "man" or "men," and "woman" or "women.")

Still more complex keyword searches can be performed by specifying proximity connectors, such as "man NEAR woman," or "man within five words of woman," or "man preceding woman by five words." A proximity matching function first evaluates the Boolean equivalent of the query, treating all proximity operators as ANDs. The proximity matching function then scans each document pointed to by the resulting reference vector 42 individually, to identify the fuzzy positions of the keywords within each document, and then compares these positions as specified by the relevant proximity operator. To identify the fuzzy positions for each keyword, the proximity matching function need only decompress and scan the dictionary reference/position vector table 33b for the document. Moreover, the table 33b need only be decompressed incrementally; that is, only the first n elements in the table need be decompressed, if a given keyword is the nth term in the table. Finally, because it is already known which dictionary (standard 35 or archive 36) a particular keyword belongs to, and because the dictionary reference/position vector table 33b is written in two partitions according to each dictionary, only the first n elements of the partition containing the keyword, where n is the position of the keyword within the partition, need be decompressed. As a result, keyword proximity searches can be very quickly performed.

X. Extracting a Metafile from the Archive

Figure 10:
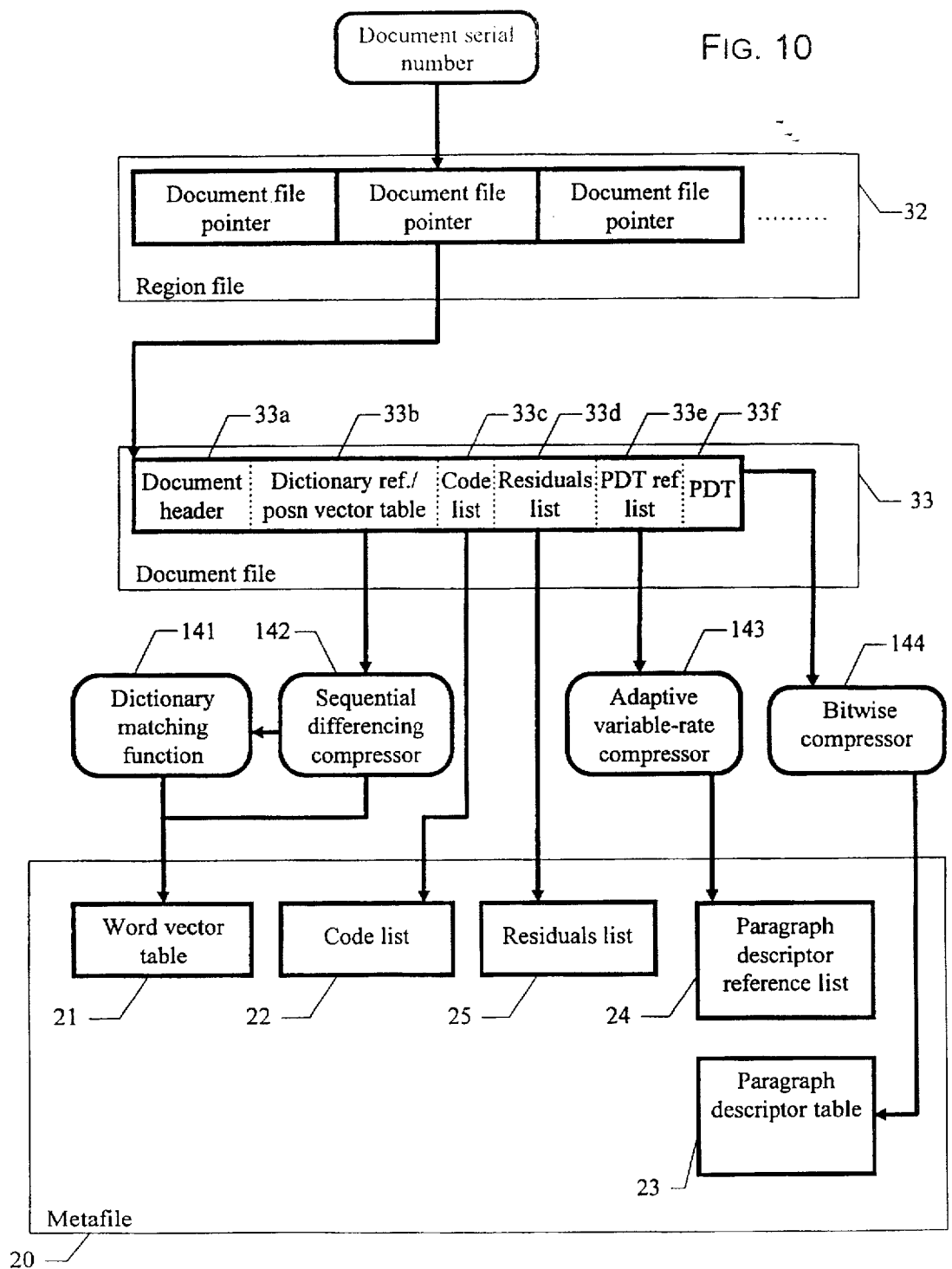
FIG. 10 is a block diagram showing the procedure for extracting a metafile from the archive.

If a desired document's serial number is known, the document's metafile 20 representation may be extracted from the archive 30 through the process described in FIG. 10. This process is substantially the reverse of the first part of the process described in FIG. 6.

An extraction function first obtains the location of the compressed document within the document file 33 by reading the document file pointer corresponding to the known serial number from the region file 32. Next, the extraction function decompresses the compressed document's dictionary reference/position vector table 33b using the sequential differencing compressor 142. The decompressed dictionary reference/position vector table 33b comprises a list of dictionary references, each of which has a position vector, as described above. Each decompressed dictionary reference is used to look up its corresponding dword from the archive and standard dictionaries 35, 36 using the dictionary matching function 141. (The archive and standard dictionaries 35, 36 are not shown in FIG. 10 for clarity.) The extraction function stores this dword in the metafile's word vector table 21. Likewise, the extraction function stores each decompressed position vector with its corresponding dword in the word vector table 21. The extraction process is then completed by decompressing the paragraph descriptor reference list 33c using the adaptive variable-rate compressor 143, and decompressing the paragraph descriptor table 33f using the bitwise compressor 144.

XI. Expanding a Metafile into a Document

To complete the retrieval process, an expansion function 70 transforms the metafile 20 into the original document 10.

Figure 11:
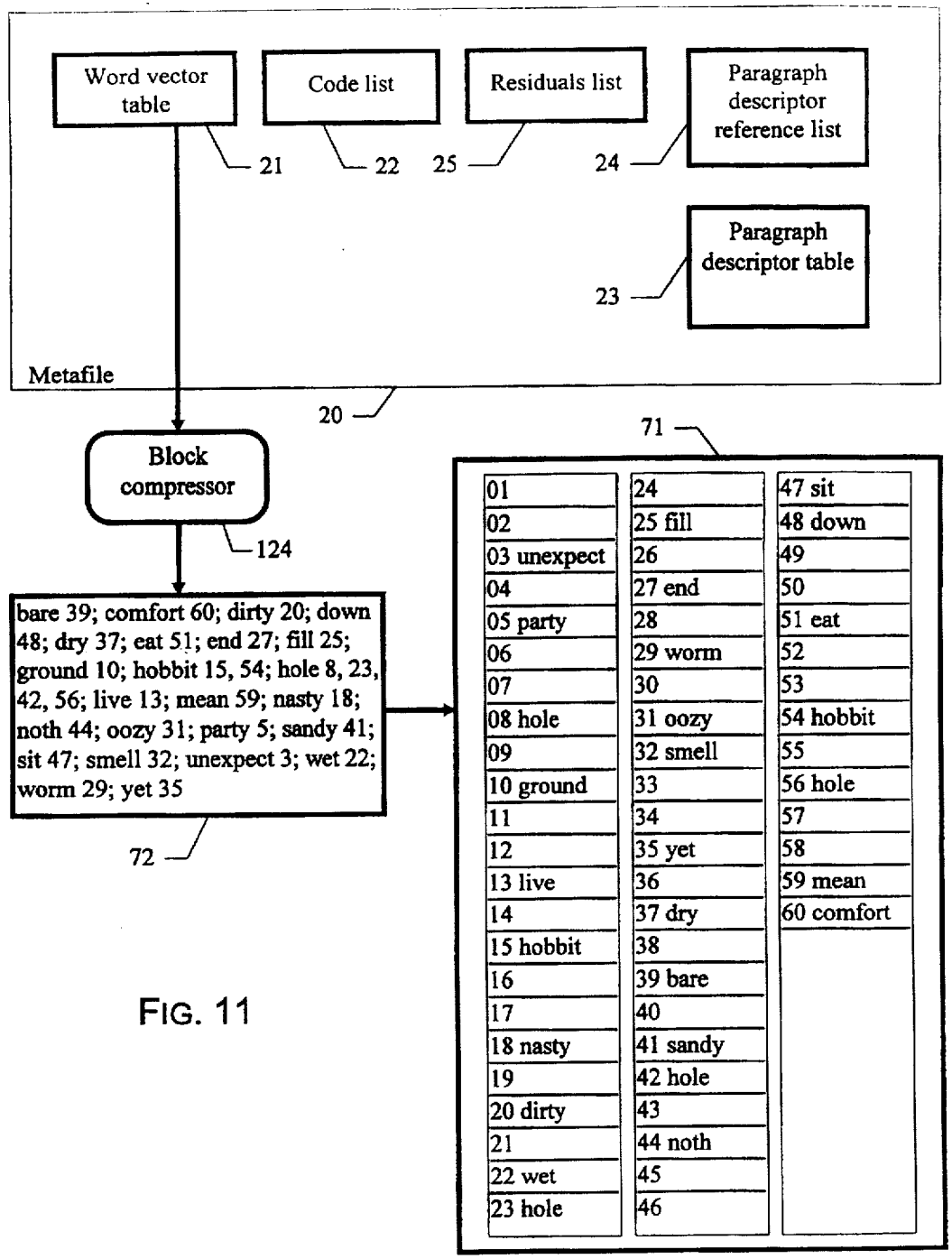
FIG. 11 is a block diagram illustrating the transformation of a metafile's word vector table into a position list, in preparation for expanding a metafile into the original document.

An expansion function first decompresses the dwords in the metafile's word vector table 21, using the dword block compressor 124. FIG. 11 illustrates the decompressed word vector table 72 using the sample text of Table 1. Next, the expansion function maps the decompressed word vector table 72 into a pointer list 71. The pointer list 71 is a list of pointers to the search terms contained in the decompressed word vector table 72. (In FIG. 11, the actual words are shown in the list 71, but only for clarity. In reality, these entries are pointers to the search terms contained in the decompressed word vector table 72.)

The expansion function maps the decompressed word vector table 72 into the pointer list 71 by first creating a list of n null (invalid) pointers, where n is the largest fuzzy position (that is, the fuzzy position of the last word in the document 10) stored in the word vector table 21. (The null entries in the example list shown in FIG. 11 are represented by empty spaces.) (As noted above, the fuzzy position of the last word in the document 10 is stored as part of the document header 33a, so there is no need to scan the word vector table 21 to determine what n is.) Next, the expansion function traverses the decompressed word vector table 72, replacing each null pointer corresponding to a fuzzy position at which each search term is located with a pointer to that search term. In other words, if a search term in the decompressed word vector table 72 occurs at fuzzy positions 10, 105, and 2386, the expansion function replaces the null pointers at positions 10, 105, and 2386 within the list 71 with pointers to that search term.

As can be appreciated by one with skill in the art, the combination of the pointer list 71, code list 22, residuals list 25, and paragraph descriptor reference list 24 together comprise a linear representation of the document 10, separated into four component parts. The expansion function therefore need only traverse these four lists, using the pointer list 71 as a primary guide as to whether the next element in the document 10 is a search term or a metacode string. If the current pointer in the pointer list 71 is null, then the expansion function decodes the next metacode string from the code list 22, by first decompressing it using the Huffman compressor 126 (which yields a sequence of block codes), and then decompressing it using the metacode block compressor 125. The decompressed metacode string is then used (1) to set temporary word transformation flags, which cause the next search term that is output to be capitalized, or pluralized, and so on (if, for example, the metacode string contains the caps or plural metacodes); (2) to set temporary output format flags, which change the format in which succeeding text is output (if the metacode string contains the format on/off metacode; as can be appreciated by one skilled in the art, the expansion function reads the type of formatting toggled from the residuals list 25); (3) to signal the beginning of a new paragraph (if the metacode string contains the new paragraph metacode; as can be appreciated by one skilled in the art, the expansion function determines the format of the new paragraph by reading the next reference from the paragraph descriptor reference list 24, which identifies the paragraph descriptor code in the paragraph descriptor table 23 which describes the new paragraph); (4) to output stopwords (first transformed, of course, by any of the current word transformation flags, which may have been set by preceding metacodes); and (5) to output punctuation. If, on the other hand, the current pointer in the pointer list 71 is valid, the expansion function outputs the search term pointed to by that pointer, first transformed as required by any of the temporary word transformation flags (which were set by the preceding metacode string). If two adjacent search terms or stopwords are encountered without any intervening punctuation, then the expansion function outputs a space character to separate them.

Because the user may desire to reproduce the original document 10 in any of a number of formats (e.g., ASCII line-delimited text, or the format of a word processor), one skilled in the art will appreciate that the expansion function will output the reconstituted text of the document 10 in different fashions depending on the format desired. If, for example, ASCII line-delimited text is desired, the expansion function will provide end-of-line delimiters when text reaches the right margin of the "page." If, on the other hand, word processor output is desired, the expansion function will provide only end-of-paragraph delimiters at the ends of paragraphs, and will preface new paragraphs with the appropriate margin, leading, and tab set codes required by the word processor. Likewise, the expansion function will translate word emphasis codes (e.g., underline or boldface) into the appropriate emphasis codes required by the word processor, if that type of output is desired.

XII. Glossary

The glossary below presents a summary of some of the terms used in this specification.

Block compression—a compression technique that replaces substrings of an input string with one or more fixed-length codes that reference a statistically generated table. The referenced entry in the table contains the replaced substring.

Dword—a block compressed, possibly truncated search term. Dwords are stored in the metafile word vector table, and the standard and specific dictionaries. In the preferred embodiment, dwords can contain no more than six bytes.

Fuzzy position—a number assigned to a search term in a document to identify its approximate position in the document.

Inverted structure—an alternative storage structure for a list of items, in which each item is listed uniquely, together with its position(s) within the list. For example, the inverted structure corresponding to the list "a, b, c, a, b, a, c, a" would be "a=1, 4,6,8; b=2,5; c=3,7."

Keyword search—an information retrieval technique in which one or more documents are searched to determine whether they contain a particular keyword. See also proximity search.

Keyword query—a common method for conducting a keyword or proximity search, in which one or more keywords are specified, optionally linked by connectors such as AND, OR, or WITHIN.

Leading (pronounced "ledding")—vertical space between lines of text. Primary leading is the vertical space between successive lines of text in a paragraph. Secondary leading is the vertical space between successive paragraphs.

Lemma—the base, uninflected form of a word. In this specification, lemma may also indicate a partially inflected form, such as the singular form of a present participle. For example, ranting is the lemma (albeit the singular lemma) of rantings; rant is the completely uninflected form.

Line-delimited document—a document in which each line of text is ended (delimited) by a special symbol, usually a "return" character. Compare with paragraph-delimited document.

Metacode—a code that describes punctuation, formatting, stopwords, and/or morphological transformation flags that occur between search terms in a document.

Metacode string—a sequence of metacodes. A single metacode string represents all of the punctuation, formatting, etc., that occurs between two search terms.

Metafile—an interim storage structure that represents the original document in partially inverted form.

Morphological transformation—the transformation of a word into another form, as in changing opened into open.

Paragraph-delimited document—a document in which each paragraph of text is ended (delimited) by a special symbol, usually a "return" character. The lines of text in each paragraph are not delimited, and therefore must be "broken" or "word wrapped" at the margins, in order to be displayed or printed. Compare with line-delimited document.

Paragraph descriptor code—a data structure that defines the format of a single paragraph. In the preferred embodiment of this invention, a paragraph descriptor code indicates the left and right boundaries (margins) of the paragraph; its first line indent or outdent amount; its primary and secondary leading; its justification; and whether its text is in all uppercase letters.

Pica—a unit of measurement; one pica equals 0.1 inches, the width of a single character of a monospace font having ten characters per inch.

Pointer—a number that indicates the absolute byte position of an element in a list, usually a list of elements having nonuniform sizes. Compare with reference.

Primary leading—the vertical space between successive lines in a paragraph; see leading.

Proximity search—a type of keyword query in which two or more keywords are linked by a proximity operator such as "near" or "within n words of" or "precedes by n words." For example, "man within/5 woman" indicates a request for all documents having the word man located within five words of the word woman.

Reference—a number that indicates either the absolute or relative position of an element in a list of uniformly sized elements. The absolute byte position of the element (a pointer) can be calculated from the reference.

Residuals—information about a document that cannot be easily or efficiently stored in the metafile's word vector table, code list, or paragraph format structures.

Search term—any word (consisting of only alphanumeric characters or, possibly, embedded periods or apostrophes in the preferred embodiment) that is not a stopword.

Secondary leading—the amount of space between successive paragraphs; see leading. Secondary leading can be viewed as the vertical space before a paragraph, after it, or both; in the preferred embodiment, secondary leading is treated as the space before the paragraph.

Sequential differencing—a technique for reducing the average magnitude of a list of ascending numbers, where each number is replaced by the difference between it and the number before it. For example, the list "1, 4, 8, 17, 18, 20" would be transformed to "1, 3, 4, 9, 1, 2" by sequential differencing.

Stopword—a word not treated as searchable because it has low information content (often called "function words"). Examples of some typical stopwords are the, of, and for.

Table—a vector of items, usually items containing vectors.

Vector—a one-dimensional list of items, usually references or pointers.

Word completion code—that portion of a block compressed search term that cannot fit within a dword. Word completion codes are, in the preferred embodiment, stored in the residuals list 25.

This invention may be embodied in other specific forms without departing from its spirit or essential characteristics. The described embodiments are to be considered in all respects only as illustrative and not restrictive. The scope of the invention is therefore indicated by the appended claims rather than by the foregoing description. All changes which come within the meaning and range of equivalency of the claims are to be embraced within that scope.

I claim:

1. A computer-based system for storing text, comprising:
a lexical parser which divides said text into search terms and all other information;

a word vector table which stores said search terms solely as an inverted structure, wherein each said search term is stored uniquely and each said search term is coupled with a list of its positions within said text; and a first auxiliary data structure which stores only said other information;

wherein said word vector table and said first auxiliary data structure contain sufficient information substantially to reproduce said text.

2. The system of claim 1, wherein said positions are counted from the beginning of the text, each search term in said text is counted as one position, and each instance of other information between said search terms is counted as one or more positions.

3. The system of claim 1, wherein said text contains words, and said search terms are the approximate lemmas of said words.

4. The system of claim 1, wherein said text contains words, and said search terms are compressed representations of said words.

5. The system of claim 1, wherein said lists of positions are compressed before storage in said word vector table.

6. The system of claim 5, wherein said lists are compressed at least in part by sequential differencing.

7. The system of claim 1, wherein said search terms are stored in said word vector table by reference to a second auxiliary data structure, said second auxiliary data structure storing said search terms.

8. The system of claim 7, wherein said text contains words, and said search terms are the approximate lemmas of said words.

9. The system of claim 7, wherein said text contains words, and said search terms are compressed representations of said words.

10. The system of claim 7, wherein said lists of positions are compressed before storage in said word vector table.

11. The system of claim 10, wherein said lists of positions are compressed at least in part by sequential differencing.

12. The system of claim 1, wherein said text comprises one or more paragraphs having paragraph formats, said formats including at least the margins of said paragraphs, and wherein said paragraph formats are stored in said first auxiliary data structure as a table of said formats and a list of references to said table.

13. A computer-based method for storing text, comprising the steps of:

dividing said text into search terms and all other information;

storing said search terms solely as an inverted structure, wherein each said search term is stored uniquely and each said search term is coupled with a list of its positions within said text; and storing only said other information in a first auxiliary data structure.

14. The method of claim 13, wherein said text contains words, and said search terms are the approximate lemmas of said words.

15. The method of claim 13, additionally comprising the step of compressing said inverted structure after said first storing step.

16. A computer-based method for compressing a particular string of symbols, comprising the steps of:

providing a large number of strings similar to said particular string;

assigning a value to nearly all substrings contained within said large number of strings, said value being equal to the frequency of occurrence of said substring in said large number of strings, multiplied by the length of said substring;

storing the highest valued substrings in a list;

assigning to each substring in said list a unique fixed-length code; and replacing each substring contained both within said particular string and said list with the code corresponding to said substring.

17. A computer-based method for compressing a particular string of symbols, comprising the steps of:

providing a large number of strings similar to said particular string;

providing a temporary list of substrings contained within said large number of strings;

assigning a value to all substrings in said temporary list, said value being equal to the frequency of occurrence of said substring in said large number of strings, multiplied by the length of said substring;

subtracting from each string in said large number of strings each substring contained in said temporary list;

assigning a value to all remaining substrings in said large number of strings, said value being equal to the frequency of occurrence of said substring in said large number of strings, multiplied by the length of said substring;

replacing all substrings in said temporary list having a value lower than any said remaining substring with the highest valued said remaining substrings;

iterating said assigning, subtracting, assigning, and replacing steps until said temporary list is substantially unchanged from the previous iteration;

assigning to each substring in said temporary list a unique fixed-length code; and replacing each substring contained both within said particular string and said list with the code corresponding to said substring.

18. A computer-based method for storing text, comprising the steps of:

dividing said text into search terms and all other information;

compressing said search terms using the method of claim 16;

storing said search terms solely as an inverted structure, wherein each said search term is stored uniquely and each said search term is coupled with a list of its positions within said text; and storing said other information in a first auxiliary data structure.

19. A computer-based method for storing text, comprising the steps of:

dividing said text into search terms and all other information;

storing said other information in a first auxiliary data structure;

compressing said search terms using the method of claim 16;

storing said search terms in a second auxiliary data structure; and storing said search terms in an inverted structure, wherein each said search term is stored uniquely by reference to said second auxiliary data structure, and each said search term is coupled with a list of its positions within said text.

20. A computer-based method for storing text, comprising the steps of:

dividing said text into search terms and all other information;

storing said search terms solely as an inverted structure, wherein each said search term is stored uniquely and each said search term is coupled with a list of its positions within said text;

compressing at least part of said other information using the method of claim 16; and storing said other information in a first auxiliary data structure.

* * * * *